United States Patent
Siau et al.

(10) Patent No.: US 9,830,987 B2
(45) Date of Patent: *Nov. 28, 2017

(54) SENSE AMPLIFIER LOCAL FEEDBACK TO CONTROL BIT LINE VOLTAGE

(71) Applicant: SANDISK TECHNOLOGIES LLC, Plano, TX (US)

(72) Inventors: Chang Siau, Saratoga, CA (US); Xiaowei Jiang, San Jose, CA (US); Yingchang Chen, Cupertino, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/151,359

(22) Filed: May 10, 2016

(65) Prior Publication Data
US 2016/0254048 A1 Sep. 1, 2016

Related U.S. Application Data

(62) Division of application No. 14/283,034, filed on May 20, 2014, now Pat. No. 9,378,814.

(Continued)

(51) Int. Cl.
*G11C 7/02* (2006.01)
*G11C 13/00* (2006.01)
(Continued)

(52) U.S. Cl.
CPC ............. *G11C 13/004* (2013.01); *G11C 7/04* (2013.01); *G11C 7/062* (2013.01); *G11C 7/067* (2013.01);
(Continued)

(58) Field of Classification Search
CPC ..... G11C 13/004; G11C 13/0069; G11C 7/04; G11C 7/062; G11C 7/067; G11C 7/12;
(Continued)

(56) References Cited

U.S. PATENT DOCUMENTS 7,542,352 B1  6/2009  Kuo
7,738,281 B2 * 6/2010  Iida .......................... G11C 5/14
                                                                    365/149

(Continued)

FOREIGN PATENT DOCUMENTS

EP  1548743  6/2005

OTHER PUBLICATIONS

PCT International Search Report dated Sep. 2, 2014, PCT Patent Application PCT/US2014/038954.

(Continued)

*Primary Examiner* — Viet Q Nguyen
(74) *Attorney, Agent, or Firm* — Vierra Magen Marcus LLP

(57) ABSTRACT

Methods for precharging bit lines using closed-loop feedback are described. In one embodiment, a sense amplifier may include a bit line precharge circuit for setting a bit line to a read voltage prior to sensing a memory cell connected to the bit line. The bit line precharge circuit may include a first transistor in a source-follower configuration with a first gate and a first source node electrically coupled to the bit line. By applying local feedback from the first source node to the first gate, the bit line settling time may be reduced. In some cases, a first voltage applied to the first gate may be determined based on a first current drawn from the first bit line. Thus, the first voltage applied to the first gate may vary over time depending on the conductivity of a selected memory cell connected to the bit line.

17 Claims, 20 Drawing Sheets

Related U.S. Application Data

(60) Provisional application No. 61/825,878, filed on May 21, 2013.

(51) Int. Cl.
*G11C 7/04* (2006.01)
*G11C 7/06* (2006.01)
*G11C 7/12* (2006.01)
*G11C 7/14* (2006.01)
*G11C 11/56* (2006.01)
*G11C 16/24* (2006.01)
*G11C 16/26* (2006.01)

(52) U.S. Cl.
CPC .................. *G11C 7/12* (2013.01); *G11C 7/14* (2013.01); *G11C 11/5642* (2013.01); *G11C 13/0069* (2013.01); *G11C 16/24* (2013.01); *G11C 16/26* (2013.01); *G11C 2013/0042* (2013.01); *G11C 2013/0045* (2013.01); *G11C 2207/063* (2013.01)

(58) Field of Classification Search
CPC ....... G11C 7/14; G11C 11/5642; G11C 16/24; G11C 16/26
USPC ...................................... 365/207, 205, 210.1
See application file for complete search history.

(56) References Cited

U.S. PATENT DOCUMENTS

| | | | |
|---|---|---|---|
| 9,007,810 B2 | 4/2015 | Siau | |
| 9,202,566 B2 | 12/2015 | Siau | |
| 9,543,030 B1* | 1/2017 | Amarnath | G11C 16/26 |
| 2007/0253255 A1* | 11/2007 | Gallo | G11C 7/02 |
| | | | 365/185.21 |
| 2009/0257288 A1 | 10/2009 | Roohparvar | |
| 2010/0220535 A1* | 9/2010 | Kang | G11C 5/147 |
| | | | 365/189.09 |
| 2012/0147644 A1 | 6/2012 | Scheuerlein | |
| 2013/0188431 A1* | 7/2013 | Scheuerlein | G11C 7/04 |
| | | | 365/189.09 |
| 2013/0250687 A1 | 9/2013 | Chan | |
| 2014/0211553 A1* | 7/2014 | Lai | G11C 29/025 |
| | | | 365/163 |
| 2014/0225652 A1* | 8/2014 | Wang | G11C 5/145 |
| | | | 327/157 |
| 2015/0213844 A1* | 7/2015 | Nguyen | G11C 5/145 |
| | | | 365/226 |

OTHER PUBLICATIONS

PCT Written Opinion of the International Searching Authority dated Sep. 2, 2014, PCT Patent Application PCT/US2014/038954.

* cited by examiner

370

SENSE AMPLIFIER LOCAL FEEDBACK TO CONTROL BIT LINE VOLTAGE

CLAIM OF PRIORITY

The present application is a divisional application of U.S. patent application Ser. No. 14/283,034, entitled "SENSE AMPLIFIER LOCAL FEEDBACK TO CONTROL BIT LINE VOLTAGE," filed May 20, 2014, which claims priority to U.S. Provisional Application No. 61/825,878, entitled "VERTICAL CROSS POINT RERAM SA LOCAL FEEDBACK TO CONTROL BIT LINE VOLTAGE," filed May 21, 2013, which is herein incorporated by reference in its entirety.

BACKGROUND

Semiconductor memory is widely used in various electronic devices such as mobile computing devices, mobile phones, solid-state drives, digital cameras, personal digital assistants, medical electronics, servers, and non-mobile computing devices. Semiconductor memory may comprise non-volatile memory or volatile memory. A non-volatile memory device allows information to be stored or retained even when the non-volatile memory device is not connected to a source of power (e.g., a battery). Examples of non-volatile memory include flash memory (e.g., NAND-type and NOR-type flash memory), Electrically Erasable Programmable Read-Only Memory (EEPROM), ferroelectric memory (e.g., FeRAM), magnetoresistive memory (e.g., MRAM), and phase change memory (e.g., PRAM). In recent years, non-volatile memory devices have been scaled in order to reduce the cost per bit. However, as process geometries shrink, many design and process challenges are presented. These challenges include increased variability in memory cell I-V characteristics, reduced memory cell sensing currents, and increased bit line settling times.

DETAILED DESCRIPTION

Figure 1A:
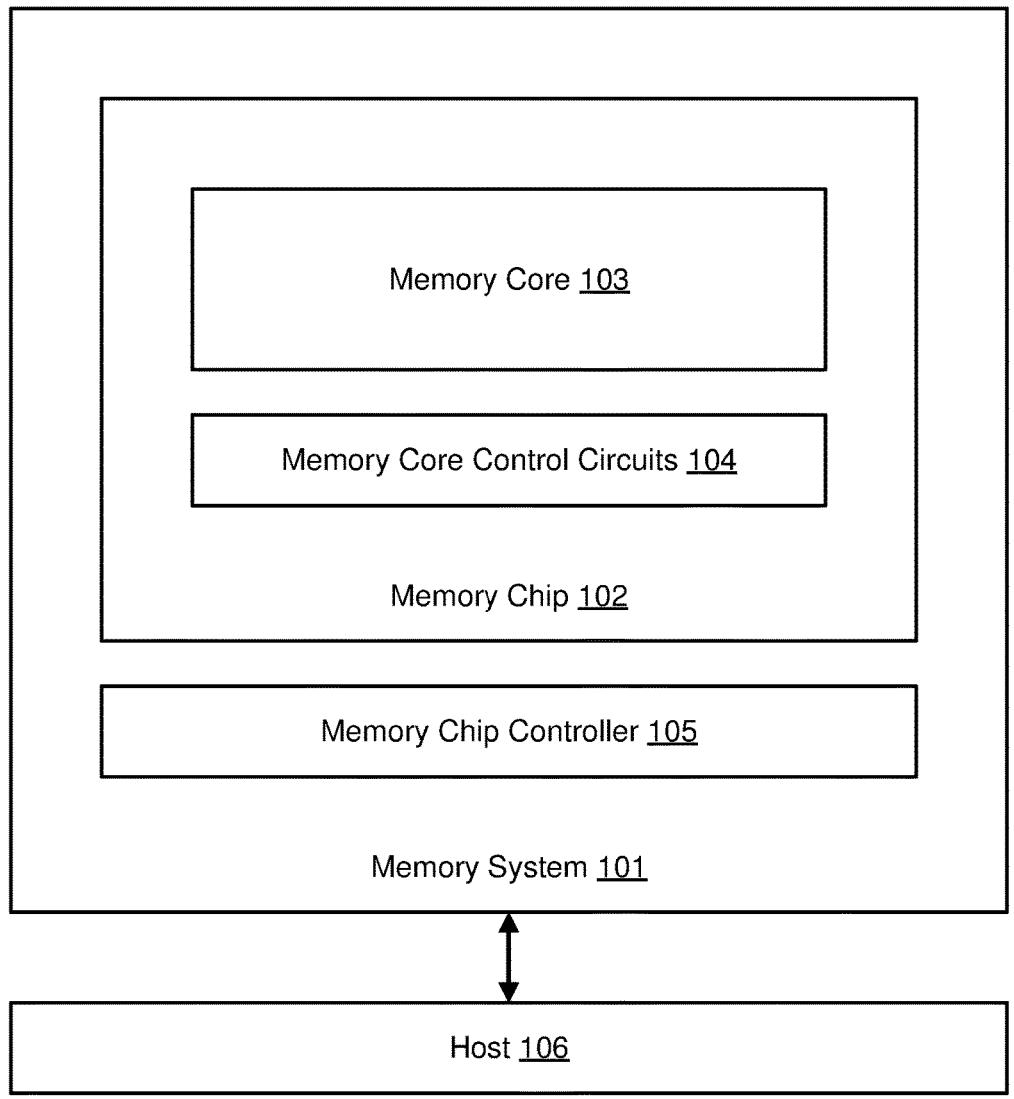
FIG. 1A depicts one embodiment of a memory system and a host.

Technology is described for precharging bit lines using closed-loop feedback. In one embodiment, a sense amplifier may include a bit line precharge circuit for setting a bit line to a read voltage prior to sensing a memory cell connected to the bit line. The bit line precharge circuit may include a first transistor (e.g., in a source-follower configuration) with a first gate and a first source node electrically coupled to the bit line (e.g., via a bit line decoder). By applying local feedback from the first source node to the first gate, the bit line settling time (i.e., the time to charge the bit line to be within a particular voltage range or to reach a particular voltage) may be reduced and the variation in bit line voltage applied to the bit line may be reduced. In some cases, a first voltage applied to the first gate may be determined or set based on a first current drawn from the first bit line. Thus, the first voltage applied to the first gate may vary over time depending on a state or conductivity of a selected memory cell connected to the bit line (e.g., whether the selected memory cell is weakly conducting or strongly conducting). Moreover, as a plurality of sense amplifiers may be coupled to a plurality of bit lines for concurrently sensing a plurality of memory cells with varying IV characteristics, local feedback within each sense amplifier may allow each of the plurality of bit lines to be biased to the read voltage independent of the varying IV characteristics of the plurality of memory cells.

In some embodiments, to reduce the area overhead of implementing closed-loop regulation per sense amplifier, the local feedback may be implemented using a common source amplifier (e.g., an NMOS device in a common source configuration). Furthermore, to reduce bit line voltage variation due to PVT (process, voltage, and temperature) variations, a source voltage applied to a source node of the common source amplifier may be generated using a replica circuit that regulates a bit line voltage applied to a set of one or more dummy memory cells. In some cases, the bit line precharge circuit may be used for charging (or regulating) a bit line to a particular voltage (or within a particular voltage range) over a range of memory cell currents (e.g., currents associated with weak OFF memory cells or strong ON memory cells) during a sensing operation, a read operation, or a program verify operation.

One issue with using a source follower configuration for precharging a bit line is that the resulting bit line voltage may vary based on the current drawn by a selected memory cell connected to the bit line. In one example, if the selected memory cell comprises an ON memory cell (or a strongly conducting memory cell), then the resulting bit line voltage may be 950 mV; however, if the selected memory cell comprises an OFF memory cell (or a memory cell placed into a non-conducting state), then the resulting bit line voltage may be 1.0V. This variation in bit line voltage may lead to reduced sensing margin. Furthermore, the bit line settling time using the source follower may be slow, especially when the bit line voltage gets close to the target bit line voltage (e.g., within 100 mV of the target bit line voltage), since the gate overdrive voltage decreases as the bit line is charged up. Thus, one benefit of using local feedback to control the bit line voltage of each selected bit line is that the variation in the bit line voltage over memory cell IV characteristics and PVT may be reduced.

In some embodiments, a memory array may comprise a cross-point memory array. A cross-point memory array may refer to a memory array in which two-terminal memory cells are placed at the intersections of a first set of control lines (e.g., word lines) arranged in a first direction and a second set of control lines (e.g., bit lines) arranged in a second direction perpendicular to the first direction. The two-terminal memory cells may include a resistance-switching material, such as a phase change material, a ferroelectric material, or a metal oxide (e.g., nickel oxide or hafnium oxide). In some cases, each memory cell in a cross-point memory array may be placed in series with a steering element or an isolation element, such as a diode, in order to reduce leakage currents. In cross-point memory arrays where the memory cells do not include an isolation element, controlling and minimizing leakage currents may be a significant issue, especially since leakage currents may vary greatly over biasing voltage and temperature.

In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate. In one example, a non-volatile storage system may include a memory array with vertical bit lines or bit lines that are arranged orthogonal to a semiconductor substrate. The substrate may comprise a silicon substrate. The memory array may include rewriteable non-volatile memory cells, wherein each memory cell includes a reversible resistance-switching element without an isolation element in series with the reversible resistance-switching element (e.g., no diode in series with the reversible resistance-switching element).

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading or programming of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., above a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

FIG. 1A depicts one embodiment of a memory system 101 and a host 106. The memory system 101 may comprise a non-volatile storage system interfacing with the host (e.g., a mobile computing device). In some cases, the memory system 101 may be embedded within the host 106. In other cases, the memory system 101 may comprise a memory card. As depicted, the memory system 101 includes a memory chip controller 105 and a memory chip 102. Although a single memory chip is depicted, the memory system 101 may include more than one memory chip (e.g., four or eight memory chips). The memory chip controller 105 may receive data and commands from host 106 and provide memory chip data to host 106. The memory chip controller 105 may include one or more state machines, page registers, SRAM, and control circuitry for controlling the operation of memory chip 102. The one or more state machines, page registers, SRAM, and control circuitry for controlling the operation of the memory chip may be referred to as managing or control circuits. The managing or control circuits may facilitate one or more memory array operations including forming, erasing, programming, or reading operations.

In some embodiments, the managing or control circuits (or a portion of the managing or control circuits) for facilitating one or more memory array operations may be integrated within the memory chip 102. The memory chip controller 105 and memory chip 102 may be arranged on a single integrated circuit. In other embodiments, memory chip controller 105 and memory chip 102 may be arranged on different integrated circuits. In some cases, the memory chip controller 105 and memory chip 102 may be integrated on a system board, logic board, or a PCB.

The memory chip 102 includes memory core control circuits 104 and a memory core 103. Memory core control circuits 104 may include logic for controlling the selection of memory blocks (or arrays) within memory core 103, controlling the generation of voltage references for biasing a particular memory array into a read or write state, or generating row and column addresses. The memory core 103 may include one or more two-dimensional arrays of memory cells or one or more three-dimensional arrays of memory cells. In one embodiment, the memory core control circuits 104 and memory core 103 are arranged on a single integrated circuit. In other embodiments, the memory core control circuits 104 (or a portion of the memory core control circuits) and memory core 103 may be arranged on different integrated circuits.

Referring to FIG. 1A, a memory operation may be initiated when host 106 sends instructions to memory chip controller 105 indicating that it would like to read data from memory system 101 or write data to memory system 101. In the event of a write (or programming) operation, host 106 will send to memory chip controller 105 both a write command and the data to be written. The data to be written may be buffered by memory chip controller 105 and error correcting code (ECC) data may be generated corresponding with the data to be written. The ECC data, which allows data errors that occur during transmission or storage to be detected and/or corrected, may be written to memory core 103 or stored in non-volatile memory within memory chip controller 105. In one embodiment, the ECC data is generated and data errors are corrected by circuitry within memory chip controller 105.

As depicted in FIG. 1A, the operation of memory chip 102 may be controlled by memory chip controller 105. In one example, before issuing a write operation to memory chip 102, memory chip controller 105 may check a status register to make sure that memory chip 102 is able to accept the data to be written. In another example, before issuing a read operation to memory chip 102, memory chip controller 105 may pre-read overhead information associated with the data to be read. The overhead information may include ECC data associated with the data to be read or a redirection pointer to a new memory location within memory chip 102 in which to read the data requested. Once a read or write operation is initiated by memory chip controller 105, memory core control circuits 104 may generate the appropriate bias voltages for word lines and bit lines within memory core 103, as well as generate the appropriate memory block, row, and column addresses.

In some embodiments, one or more managing or control circuits may be used for controlling the operation of a memory array. The one or more managing or control circuits may provide control signals to a memory array in order to perform a read operation and/or a write operation on the memory array. In one example, the one or more managing or control circuits may include any one of or a combination of control circuitry, state machine, decoders, sense amplifiers, read/write circuits, and/or controllers. The one or more managing circuits may perform or facilitate one or more memory array operations including erasing, programming, or reading operations. In one example, one or more managing circuits may comprise an on-chip memory controller for determining row and column address, word line and bit line addresses, memory array enable signals, and data latching signals.

Figure 1B:
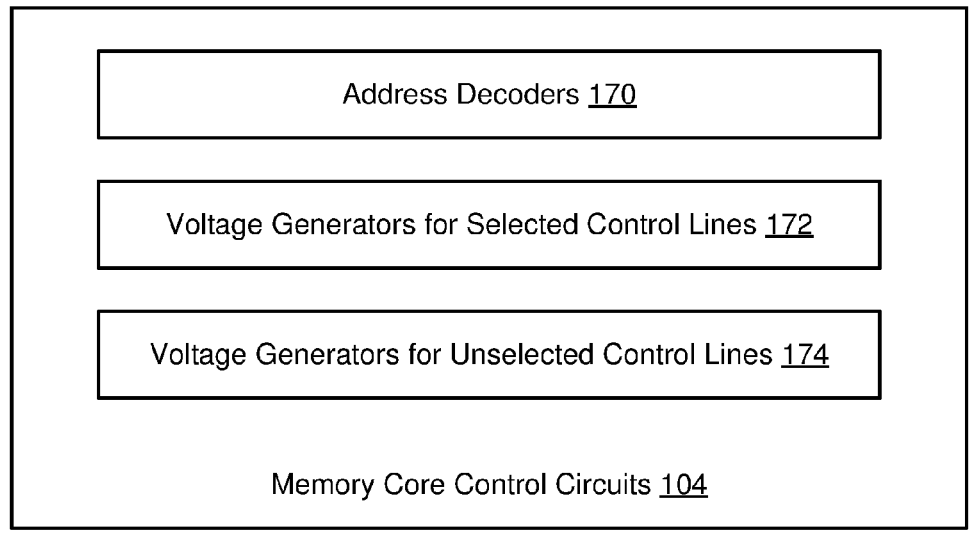
FIG. 1B depicts one embodiment of memory core control circuits.

FIG. 1B depicts one embodiment of memory core control circuits 104. As depicted, the memory core control circuits 104 include address decoders 170, voltage generators for selected control lines 172, and voltage generators for unselected control lines 174. Control lines may include word lines, bit lines, or a combination of word lines and bit lines. Selected control lines may include selected word lines or selected bit lines that are used to place memory cells into a selected state. Unselected control lines may include unselected word lines or unselected bit lines that are used to place memory cells into an unselected state. The voltage generators (or voltage regulators) for selected control lines 172 may comprise one or more voltage generators for generating selected control line voltages. The voltage generators for unselected control lines 174 may comprise one or more voltage generators for generating unselected control line voltages. Address decoders 170 may generate memory block addresses, as well as row addresses and column addresses for a particular memory block.

FIGS. 1C-1F depict one embodiment of a memory core organization that includes a memory core having multiple memory bays, and each memory bay having multiple memory blocks. Although a memory core organization is disclosed where memory bays comprise memory blocks, and memory blocks comprise a group of memory cells, other organizations or groupings can also be used with the technology described herein.

Figure 1C:
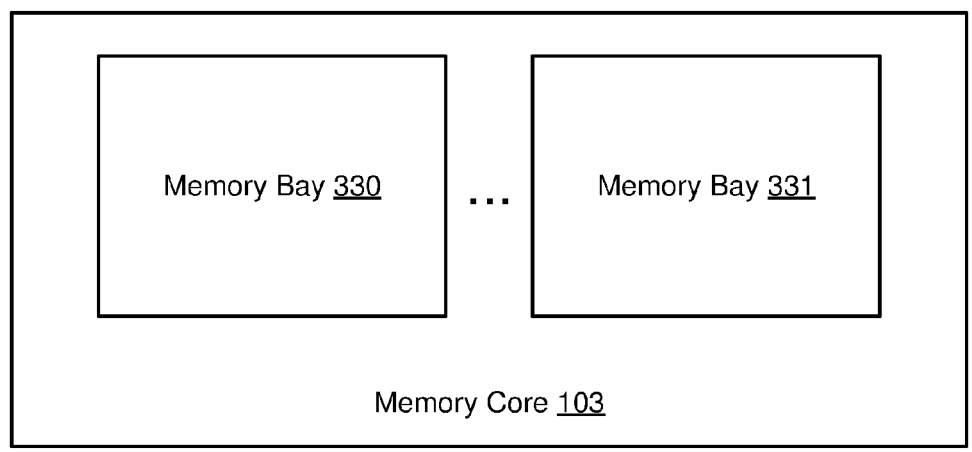
FIG. 1C depicts one embodiment of a memory core.

FIG. 1C depicts one embodiment of memory core 103 in FIG. 1A. As depicted, memory core 103 includes memory bay 330 and memory bay 331. In some embodiments, the number of memory bays per memory core can be different for different implementations. For example, a memory core may include only a single memory bay or a plurality of memory bays (e.g., 16 memory bays).

Figure 1D:
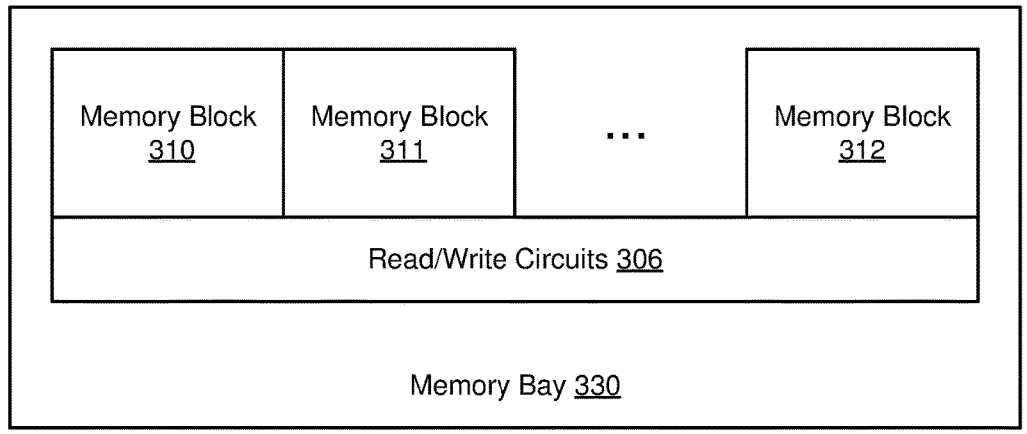
FIG. 1D depicts one embodiment of a memory bay.

FIG. 1D depicts one embodiment of memory bay 330 in FIG. 1C. As depicted, memory bay 330 includes memory blocks 310-312 and read/write circuits 306. In some embodiments, the number of memory blocks per memory bay may be different for different implementations. For example, a memory bay may include one or more memory blocks (e.g., 32 memory blocks per memory bay). Read/write circuits 306 include circuitry for reading and writing memory cells within memory blocks 310-312. As depicted, the read/write circuits 306 may be shared across multiple memory blocks within a memory bay. This allows chip area to be reduced since a single group of read/write circuits 306 may be used to support multiple memory blocks. However, in some embodiments, only a single memory block may be electrically coupled to read/write circuits 306 at a particular time to avoid signal conflicts.

In some embodiments, read/write circuits 306 may be used to write one or more pages of data into the memory blocks 310-312 (or into a subset of the memory blocks). The memory cells within the memory blocks 310-312 may permit direct over-writing of pages (i.e., data representing a page or a portion of a page may be written into the memory blocks 310-312 without requiring an erase or reset operation to be performed on the memory cells prior to writing the data). In one example, the memory system 101 in FIG. 1A may receive a write command including a target address and a set of data to be written to the target address. The memory system 101 may perform a read-before-write (RBW) operation to read the data currently stored at the target address and/or to acquire overhead information (e.g., ECC information) before performing a write operation to write the set of data to the target address.

In some cases, read/write circuits 306 may be used to program a particular memory cell to be in one of three or more data/resistance states (i.e., the particular memory cell may comprise a multi-level memory cell). In one example, the read/write circuits 306 may apply a first voltage difference (e.g., 2V) across the particular memory cell to program the particular memory cell into a first state of the three or more data/resistance states or a second voltage difference (e.g., 1V) across the particular memory cell that is less than the first voltage difference to program the particular memory cell into a second state of the three or more data/resistance states. Applying a smaller voltage difference across the particular memory cell may cause the particular memory cell to be partially programmed or programmed at a slower rate than when applying a larger voltage difference. In another example, the read/write circuits 306 may apply a first voltage difference across the particular memory cell for a first time period (e.g., 150 ns) to program the particular memory cell into a first state of the three or more data/resistance states or apply the first voltage difference across the particular memory cell for a second time period less than the first time period (e.g., 50 ns). One or more programming pulses followed by a memory cell verification phase may be used to program the particular memory cell to be in the correct state.

Figure 1E:
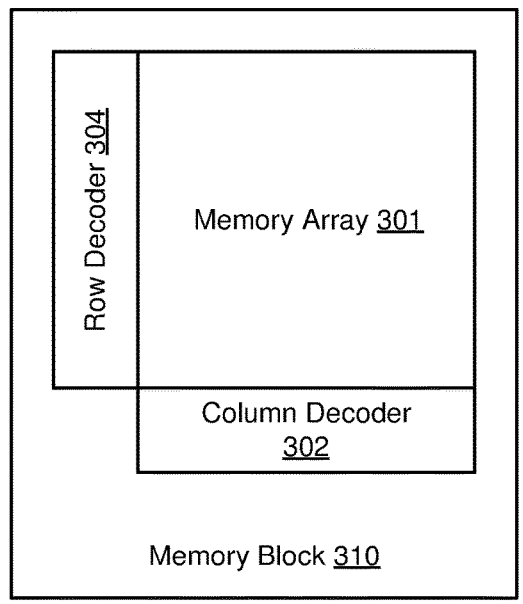
FIG. 1E depicts one embodiment of a memory block.

FIG. 1E depicts one embodiment of memory block 310 in FIG. 1D. As depicted, memory block 310 includes a memory array 301, row decoder 304, and column decoder 302. Memory array 301 may comprise a contiguous group of memory cells having contiguous word lines and bit lines. Memory array 301 may comprise one or more layers of memory cells. Memory array 310 may comprise a two-dimensional memory array or a three-dimensional memory array. The row decoder 304 decodes a row address and selects a particular word line in memory array 301 when appropriate (e.g., when reading or writing memory cells in memory array 301). The column decoder 302 decodes a column address and selects a particular group of bit lines in memory array 301 to be electrically coupled to read/write circuits, such as read/write circuits 306 in FIG. 1D. In one embodiment, the number of word lines is 4K per memory layer, the number of bit lines is 1K per memory layer, and the number of memory layers is 4, providing a memory array 301 containing 16M memory cells.

Figure 1F:
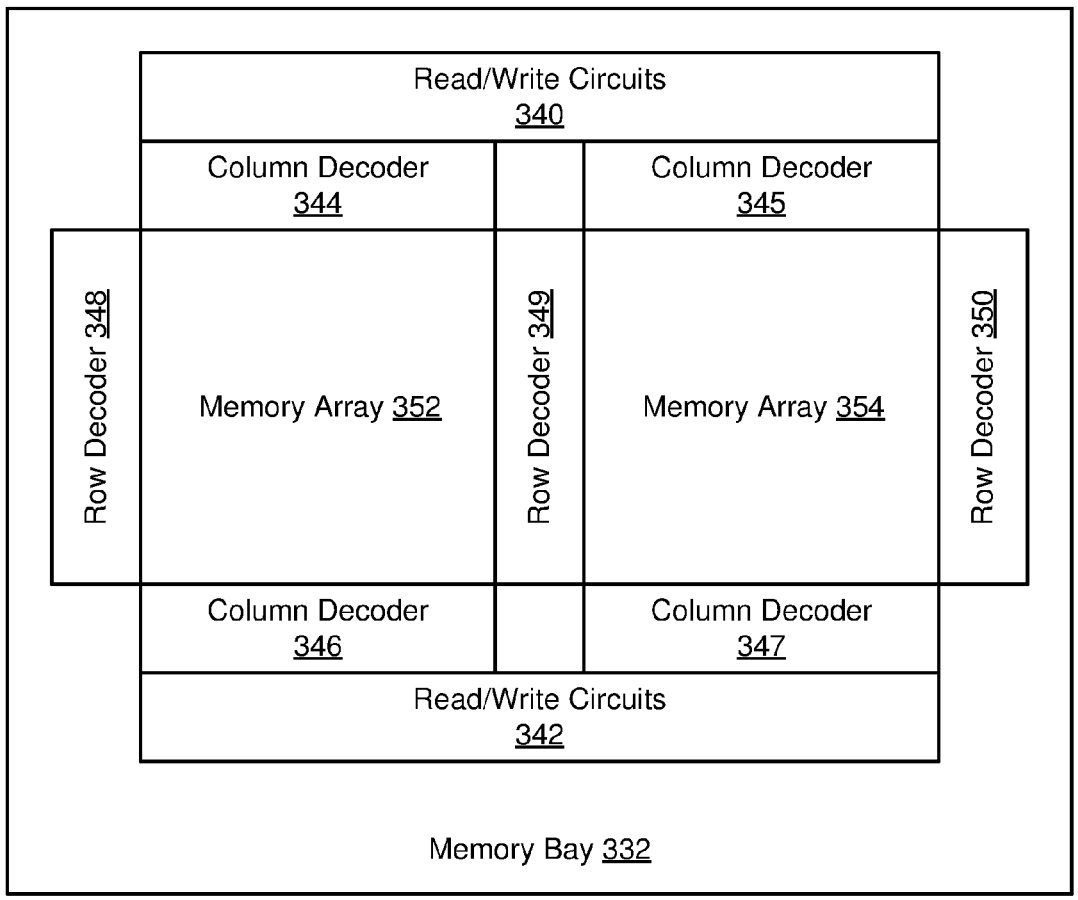
FIG. 1F depicts another embodiment of a memory bay.

FIG. 1F depicts one embodiment of a memory bay 332. Memory bay 332 is one example of an alternative implementation for memory bay 330 in FIG. 1D. In some embodiments, row decoders, column decoders, and read/write circuits may be split or shared between memory arrays. As depicted, row decoder 349 is shared between memory arrays 352 and 354 because row decoder 349 controls word lines in both memory arrays 352 and 354 (i.e., the word lines driven by row decoder 349 are shared). Row decoders 348 and 349 may be split such that even word lines in memory array 352 are driven by row decoder 348 and odd word lines in memory array 352 are driven by row decoder 349. Column decoders 344 and 346 may be split such that even bit lines in memory array 352 are controlled by column decoder 346 and odd bit lines in memory array 352 are driven by column decoder 344. The selected bit lines controlled by column decoder 344 may be electrically coupled to read/write circuits 340. The selected bit lines controlled by column decoder 346 may be electrically coupled to read/write circuits 342. Splitting the read/write circuits into read/write circuits 340 and 342 when the column decoders are split may allow for a more efficient layout of the memory bay.

Figure 2A:
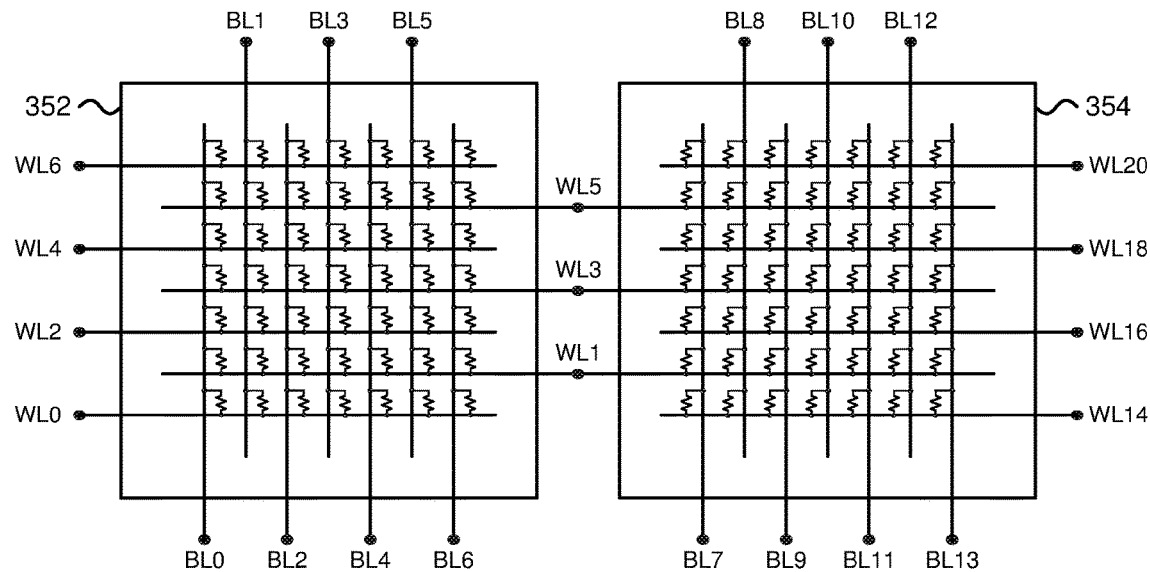
FIG. 2A depicts one embodiment of a schematic diagram corresponding with the memory bay of FIG. 1F.

FIG. 2A depicts one embodiment of a schematic diagram (including word lines and bit lines) corresponding with memory bay 332 in FIG. 1F. As depicted, word lines WL1, WL3, and WL5 are shared between memory arrays 352 and 354 and controlled by row decoder 349 of FIG. 1F. Word lines WL0, WL2, WL4, and WL6 are driven from the left side of memory array 352 and controlled by row decoder 348 of FIG. 1F. Word lines WL14, WL16, WL18, and WL20 are driven from the right side of memory array 354 and controlled by row decoder 350 of FIG. 1F. Bit lines BL0, BL2, BL4, and BL6 are driven from the bottom of memory array 352 and controlled by column decoder 346 of FIG. 1F. Bit lines BL1, BL3, and BL5 are driven from the top of memory array 352 and controlled by column decoder 344 of FIG. 1F.

In one embodiment, the memory arrays 352 and 354 may comprise memory layers that are oriented in a horizontal plane that is horizontal to the supporting substrate. In another embodiment, the memory arrays 352 and 354 may comprise memory layers that are oriented in a vertical plane that is vertical with respect to the supporting substrate (i.e., the vertical plane is perpendicular to the supporting substrate).

Figure 2B:
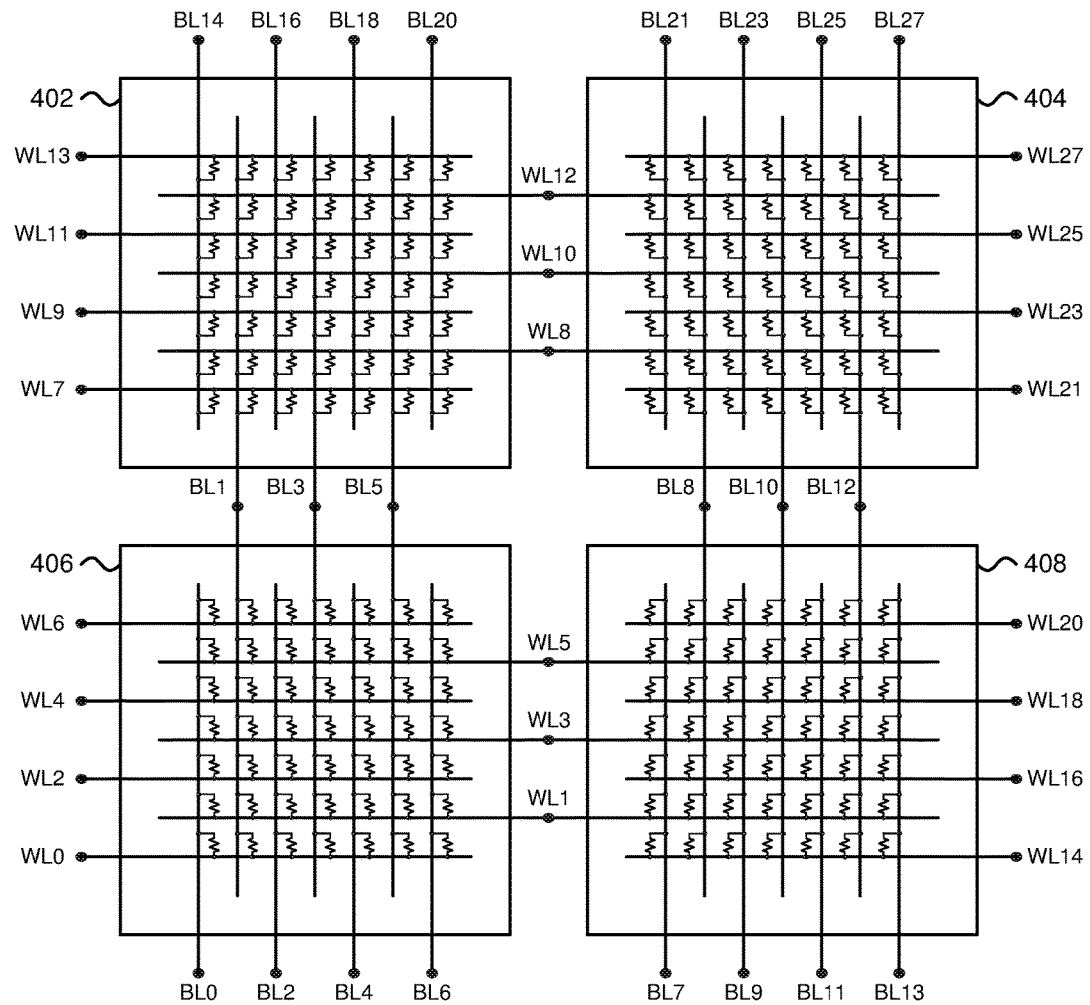
FIG. 2B depicts one embodiment of a schematic diagram corresponding with a memory bay arrangement wherein word lines and bit lines are shared across memory blocks, and both row decoders and column decoders are split.

FIG. 2B depicts one embodiment of a schematic diagram (including word lines and bit lines) corresponding with a memory bay arrangement wherein word lines and bit lines are shared across memory blocks, and both row decoders and column decoders are split. Sharing word lines and/or bit lines helps to reduce layout area since a single row decoder and/or column decoder can be used to support two memory arrays. As depicted, word lines WL1, WL3, and WL5 are shared between memory arrays 406 and 408. Bit lines BL1, BL3, and BL5 are shared between memory arrays 406 and 402. Row decoders are split such that word lines WL0, WL2, WL4, and WL6 are driven from the left side of memory array 406 and word lines WL1, WL3, and WL5 are driven from the right side of memory array 406. Column decoders are split such that bit lines BL0, BL2, BL4, and BL6 are driven from the bottom of memory array 406 and bit lines BL1, BL3, and BL5 are driven from the top of memory array 406. Splitting row and/or column decoders also helps to relieve layout constraints (e.g., the column decoder pitch can be relieved by 2x since the split column decoders need only drive every other bit line instead of every bit line).

Figure 3A:
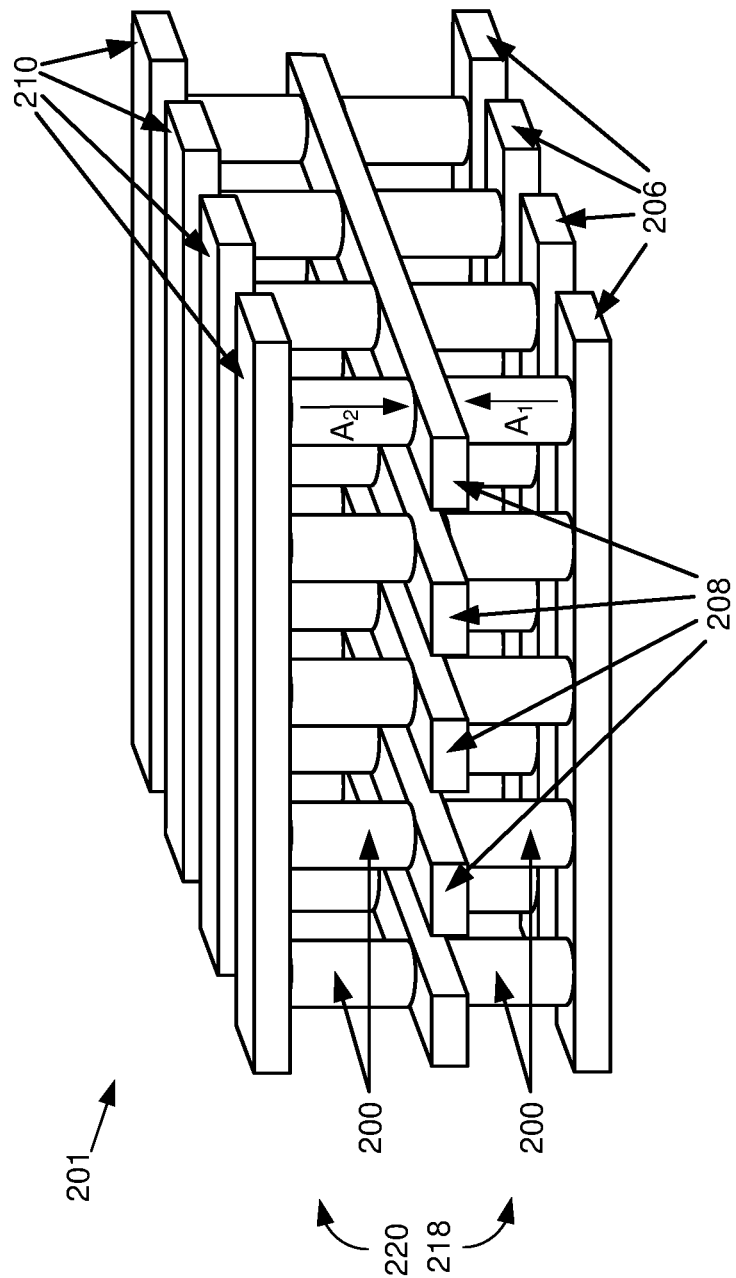
FIG. 3A depicts one embodiment of a portion of a monolithic three-dimensional memory array.

FIG. 3A depicts one embodiment of a portion of a monolithic three-dimensional memory array 201 that includes a second memory level 220 positioned above a first memory level 218. Memory array 201 is one example of an implementation for memory array 301 in FIG. 1E. The bit lines 206 and 210 are arranged in a first direction and the word lines 208 are arranged in a second direction perpendicular to the first direction. As depicted, the upper conductors of first memory level 218 may be used as the lower conductors of the second memory level 220 that is positioned above the first memory level. In a memory array with additional layers of memory cells, there would be corresponding additional layers of bit lines and word lines.

As depicted in FIG. 3A, memory array 201 includes a plurality of memory cells 200. The memory cells 200 may include re-writeable memory cells. The memory cells 200 may include non-volatile memory cells or volatile memory cells. With respect to first memory level 218, a first portion of memory cells 200 are between and connect to bit lines 206 and word lines 208. With respect to second memory level 220, a second portion of memory cells 200 are between and connect to bit lines 210 and word lines 208. In one embodiment, each memory cell includes a steering element (e.g., a diode) and a memory element (i.e., a state change element). In one example, the diodes of the first memory level 218 may be upward pointing diodes as indicated by arrow $A_1$ (e.g., with p regions at the bottom of the diodes), while the diodes of the second memory level 220 may be downward pointing diodes as indicated by arrow $A_2$ (e.g., with n regions at the bottom of the diodes), or vice versa. In another embodiment, each memory cell includes only a state change element. The absence of a diode (or other steering element) from a memory cell may reduce the process complexity and costs associated with manufacturing a memory array.

In one embodiment, the memory cells 200 of FIG. 3A comprise re-writable non-volatile memory cells including a reversible resistance-switching element. A reversible resistance-switching element may include a reversible resistivity-switching material having a resistivity that may be reversibly switched between two or more states. In one embodiment, the reversible resistance-switching material may include a metal oxide (e.g., a binary metal oxide). The metal oxide may include nickel oxide or hafnium oxide. In another embodiment, the reversible resistance-switching material may include a phase change material. The phase change material may include a chalcogenide material. In some cases, the re-writeable non-volatile memory cells may comprise resistive RAM (ReRAM) devices.

In another embodiment, the memory cells 200 of FIG. 3A may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Referring to FIG. 3A, in one embodiment of a read operation, the data stored in one of the plurality of memory cells 200 may be read by biasing one of the word lines (i.e., the selected word line) to a selected word line voltage in read mode (e.g., 0V). A read circuit may then be used to bias a selected bit line connected to the selected memory cell to the selected bit line voltage in read mode (e.g., 1.0V). In some cases, in order to avoid sensing leakage current from the many unselected word lines to the selected bit line, the unselected word lines may be biased to the same voltage as the selected bit lines (e.g., 1.0V). To avoid leakage current from the selected word line to the unselected bit lines, the unselected bit lines may be biased to the same voltage as the selected word line (e.g., 0V); however, biasing the unselected word lines to the same voltage as the selected bit lines and biasing the unselected bit lines to the same voltage as the selected word line may place a substantial voltage stress across the unselected memory cells driven by both the unselected word lines and the unselected bit lines.

In an alternative read biasing scheme, both the unselected word lines and the unselected bit lines may be biased to an intermediate voltage that is between the selected word line voltage and the selected bit line voltage. Applying the same voltage to both the unselected word lines and the unselected bit lines may reduce the voltage stress across the unselected memory cells driven by both the unselected word lines and the unselected bit lines; however, the reduced voltage stress comes at the expense of increased leakage currents associated with the selected word line and the selected bit line. Before the selected word line voltage has been applied to the selected word line, the selected bit line voltage may be applied to the selected bit line, and a read circuit may then sense an auto zero amount of current through the selected memory bit line which is subtracted from the bit line current in a second current sensing when the selected word line voltage is applied to the selected word line. The leakage current may be subtracted out by using the auto zero current sensing.

Referring to FIG. 3A, in one embodiment of a write operation, the reversible resistance-switching material may be in an initial high-resistivity state that is switchable to a low-resistivity state upon application of a first voltage and/or current. Application of a second voltage and/or current may return the reversible resistance-switching material back to the high-resistivity state. Alternatively, the reversible resistance-switching material may be in an initial low-resistance state that is reversibly switchable to a high-resistance state upon application of the appropriate voltage(s) and/or current(s). When used in a memory cell, one resistance state may represent a binary data "0" while another resistance state may represent a binary data "1." In some cases, a memory cell may be considered to comprise more than two data/resistance states (i.e., a multi-level memory cell). In some cases, a write operation may be similar to a read operation except with a larger voltage range placed across the selected memory cells.

The process of switching the resistance of a reversible resistance-switching element from a high-resistivity state to a low-resistivity state may be referred to as SETTING the reversible resistance-switching element. The process of switching the resistance from the low-resistivity state to the high-resistivity state may be referred to as RESETTING the reversible resistance-switching element. The high-resistivity state may be associated with binary data "0" and the low-resistivity state may be associated with binary data "1." In other embodiments, SETTING and RESETTING operations and/or the data encoding can be reversed. In some embodiments, the first time a resistance-switching element is SET may require a higher than normal programming voltage and may be referred to as a FORMING operation.

Referring to FIG. 3A, in one embodiment of a write operation, data may be written to one of the plurality of memory cells 200 by biasing one of the word lines (i.e., the selected word line) to the selected word line voltage in write mode (e.g., 5V). A write circuit may be used to bias the bit line connected to the selected memory cell to the selected bit line voltage in write mode (e.g., 0V). In some cases, in order to prevent program disturb of unselected memory cells sharing the selected word line, the unselected bit lines may be biased such that a first voltage difference between the selected word line voltage and the unselected bit line voltage is less than a first disturb threshold. To prevent program disturb of unselected memory cells sharing the selected bit line, the unselected word lines may be biased such that a second voltage difference between the unselected word line voltage and the selected bit line voltage is less than a second disturb threshold. The first disturb threshold and the second disturb threshold may be different depending on the amount of time in which the unselected memory cells susceptible to disturb are stressed.

In one write biasing scheme, both the unselected word lines and the unselected bit lines may be biased to an intermediate voltage that is between the selected word line voltage and the selected bit line voltage. The intermediate voltage may be generated such that a first voltage difference across unselected memory cells sharing a selected word line is greater than a second voltage difference across other unselected memory cells sharing a selected bit line. One reason for placing the larger voltage difference across the unselected memory cells sharing a selected word line is that the memory cells sharing the selected word line may be verified immediately after a write operation in order to detect a write disturb.

Figure 3B:
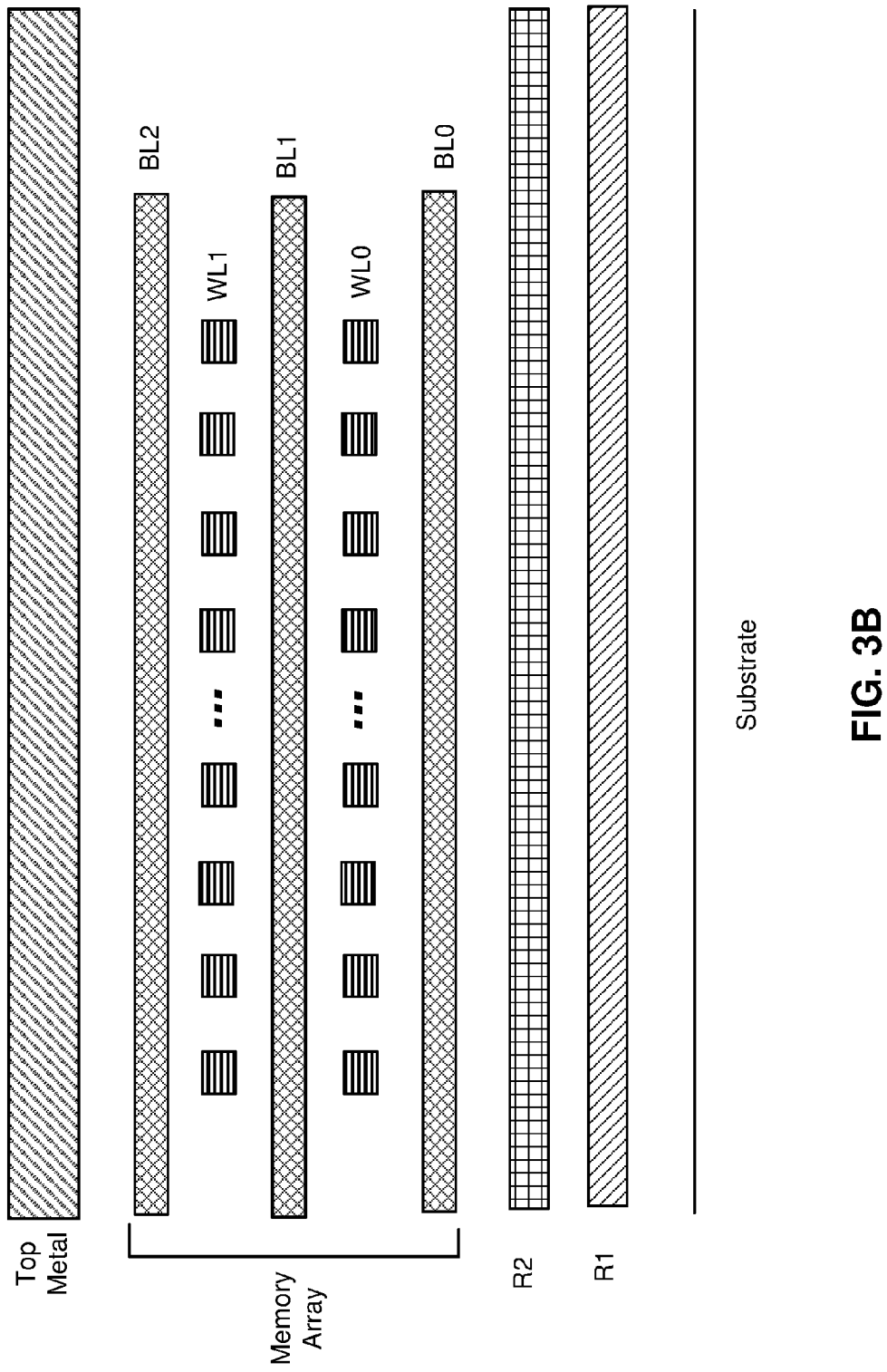
FIG. 3B depicts a subset of the memory array and routing layers of one embodiment of a three-dimensional memory array.

FIG. 3B depicts a subset of the memory array and routing layers of one embodiment of a three-dimensional memory array, such as memory array 301 in FIG. 1E. As depicted, the Memory Array layers are positioned above the Substrate. The Memory Array layers include bit line layers BL0, BL1 and BL2, and word line layers WL0 and WL1. In other embodiments, additional bit line and word line layers can also be implemented. Supporting circuitry (e.g., row decoders, column decoders, and read/write circuits) may be arranged on the surface of the Substrate with the Memory Array layers fabricated above the supporting circuitry. An integrated circuit implementing a three-dimensional memory array may also include multiple metal layers for routing signals between different components of the supporting circuitry, and between the supporting circuitry and the bit lines and word lines of the memory array. These routing layers can be arranged above the supporting circuitry that is implemented on the surface of the Substrate and below the Memory Array layers.

As depicted in FIG. 3B, two metal layers R1 and R2 are used for routing layers; however, other embodiments can include more or less than two metal layers. In one example, these metal layers R1 and R2 are formed of tungsten (about 1 ohm/square). Positioned above the Memory Array layers may be one or more top metal layers used for routing signals between different components of the integrated circuit, such as the Top Metal layer. In one example, the Top Metal layer is formed of copper or aluminum (about 0.05 ohms/square), which may provide a smaller resistance per unit area than metal layers R1 and R2. In some cases, metal layers R1 and R2 may not be implemented using the same materials as those used for the Top Metal layers because the metal used for R1 and R2 must be able to withstand the processing steps for fabricating the Memory Array layers on top of R1 and R2 (e.g., satisfying a particular thermal budget during fabrication).

Figure 3C:
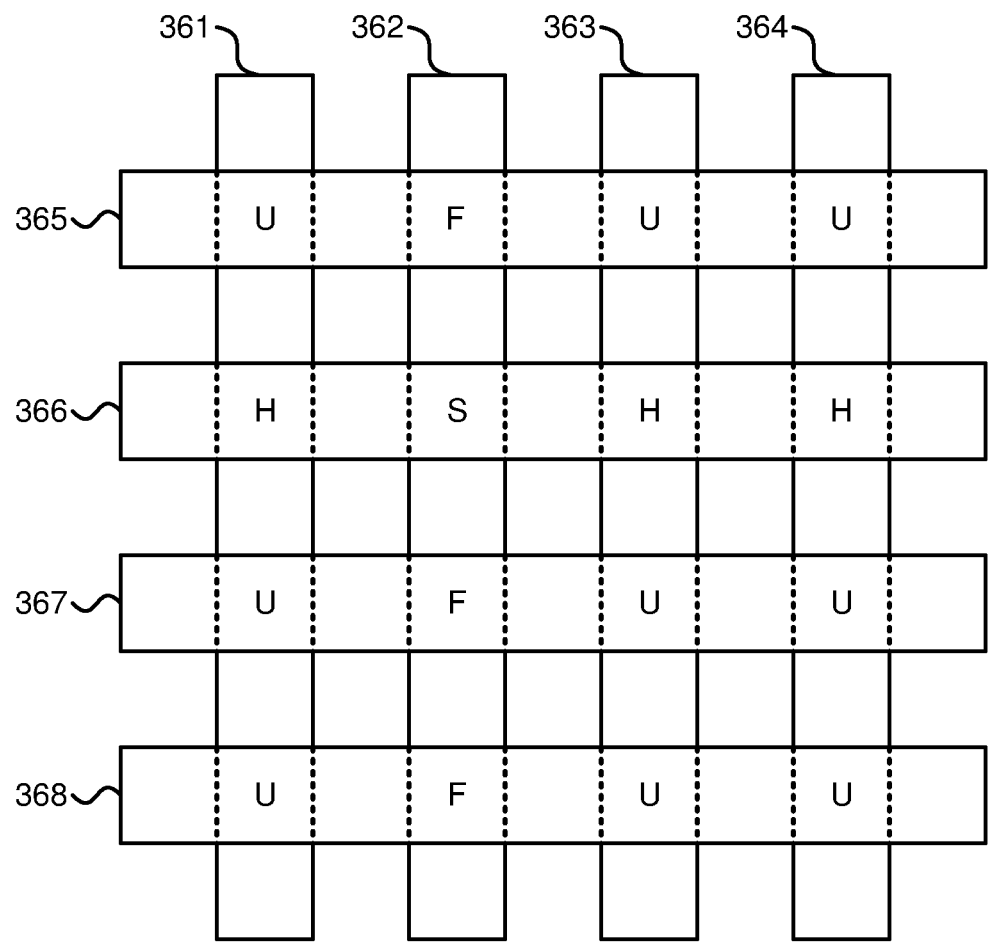
FIGS. 3C-3D depicts various embodiments of a cross-point memory array.

FIG. 3C depicts one embodiment of a cross-point memory array 360. The cross-point memory array 360 may correspond with memory array 201 in FIG. 3A. As depicted, cross-point memory array 360 includes word lines 365-368 and bit lines 361-364. Word line 366 comprises a selected word line and bit line 362 comprises a selected bit line. At the intersection of selected word line 366 and selected bit line 362 is a selected memory cell (an S cell). The voltage across the S cell is the difference between the selected word line voltage and the selected bit line voltage. Memory cells at the intersections of the selected word line 366 and the unselected bit lines 361, 363, and 364 comprise unselected memory cells (H cells). H cells are unselected memory cells that share a selected word line that is biased to the selected word line voltage. The voltage across the H cells is the difference between the selected word line voltage and the unselected bit line voltage. Memory cells at the intersections of the selected bit line 362 and the unselected word lines 365, 367, and 368 comprise unselected memory cells (F cells). F cells are unselected memory cells that share a selected bit line that is biased to a selected bit line voltage. The voltage across the F cells is the difference between the unselected word line voltage and the selected bit line voltage. Memory cells at the intersections of the unselected word lines 365, 367, and 368 and the unselected bit lines 361, 363, and 364 comprise unselected memory cells (U cells). The voltage across the U cells is the difference between the unselected word line voltage and the unselected bit line voltage.

The number of F cells is related to the length of the bit lines (or the number of memory cells connected to a bit line) while the number of H cells is related to the length of the word lines (or the number of memory cells connected to a word line). The number of U cells is related to the product of the word line length and the bit line length. In one embodiment, each memory cell sharing a particular word line, such as word line 365, may be associated with a particular page stored within the cross-point memory array 360.

Figure 3D:
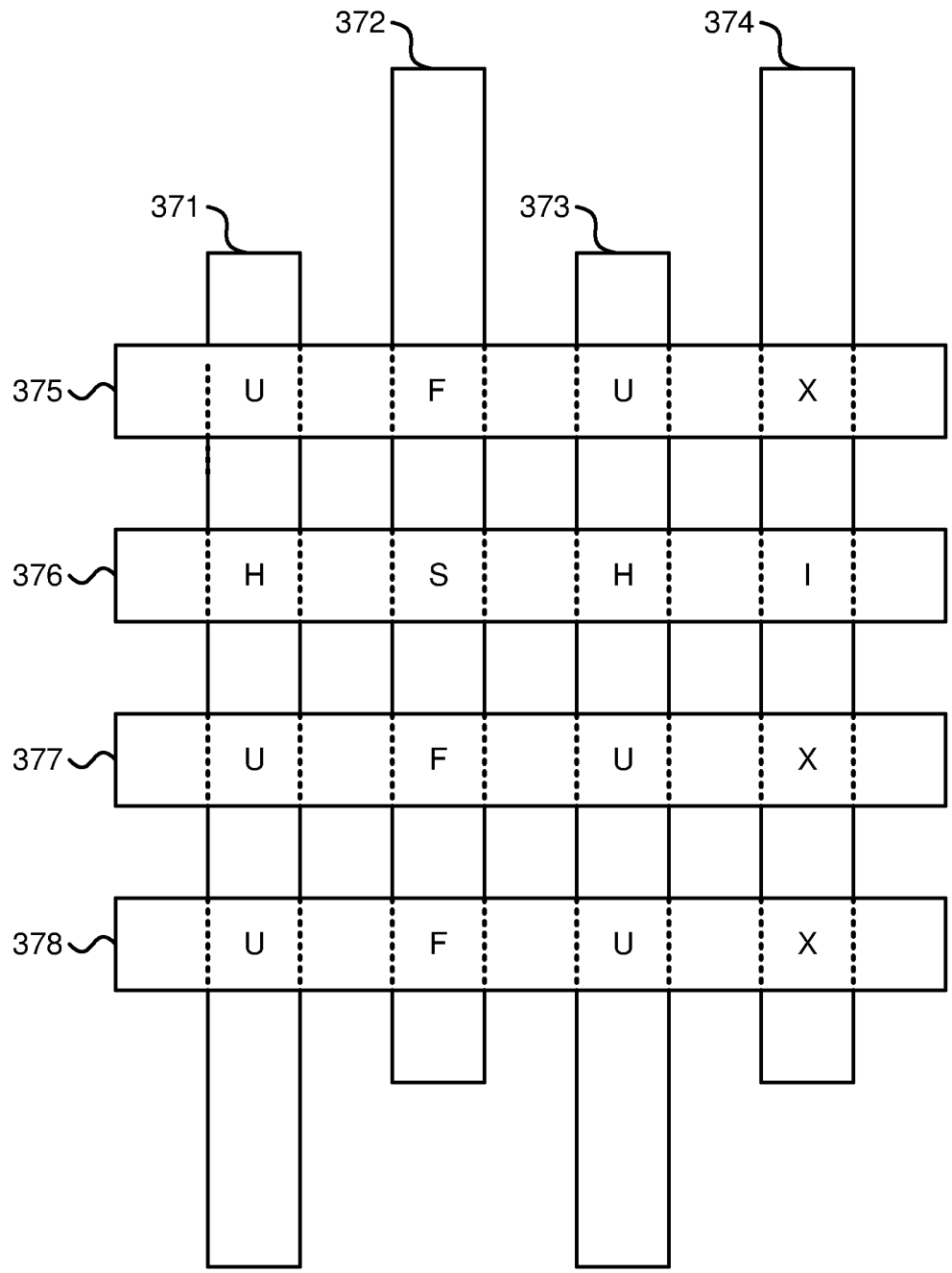

FIG. 3D depicts an alternative embodiment of a cross-point memory array 370. The cross-point memory array 370 may correspond with memory array 201 in FIG. 3A. As depicted, cross-point memory array 370 includes word lines 375-378 and bit lines 371-374. Word line 376 comprises a selected word line and bit lines 372 and 374 comprise selected bit lines. Although both bit lines 372 and 374 are selected, the voltages applied to bit line 372 and bit line 374 may be different. For example, in the case that bit line 372 is associated with a first memory cell to be programmed (i.e., an S cell), then bit line 372 may be biased to a selected bit line voltage in order to program the first memory cell. In the case that bit line 374 is associated with a second memory cell that is not to be programmed (i.e., an I cell), then bit line 374 may be biased to a program inhibit voltage (i.e., to a bit line voltage that will prevent the second memory cell from being programmed).

At the intersection of selected word line 376 and selected bit line 374 is a program inhibited memory cell (an I cell). The voltage across the I cell is the difference between the selected word line voltage and the program inhibit voltage. Memory cells at the intersections of the selected bit line 374 and the unselected word lines 375, 377, and 378 comprise unselected memory cells (X cells). X cells are unselected memory cells that share a selected bit line that is biased to a program inhibit voltage. The voltage across the X cells is the difference between the unselected word line voltage and the program inhibit voltage. In one embodiment, the program inhibit voltage applied to the selected bit line 374 may be similar to the unselected bit line voltage. In another embodiment, the program inhibit voltage may be a voltage that is greater than or less than the unselected bit line voltage. For example, the program inhibit voltage may be set to a voltage that is between the selected word line voltage and the unselected bit line voltage. In some cases, the program inhibit voltage applied may be a function of temperature. In one example, the program inhibit voltage may track the unselected bit line voltage over temperature.

In one embodiment, two or more pages may be associated with a particular word line. In one example, word line 375 may be associated with a first page and a second page. The first page may correspond with bit lines 371 and 373 and the second page may correspond with bit lines 372 and 374. In this case, the first page and the second page may correspond with interdigitated memory cells that share the same word line. When a memory array operation is being performed on the first page (e.g., a programming operation) and the selected word line 376 is biased to the selected word line voltage, one or more other pages also associated with the selected word line 376 may comprise H cells because the memory cells associated with the one or more other pages will share the same selected word line as the first page.

In some embodiments, not all unselected bit lines may be driven to an unselected bit line voltage. Instead, a number of unselected bit lines may be floated and indirectly biased via the unselected word lines. In this case, the memory cells of memory array 370 may comprise resistive memory elements without isolating diodes. In one embodiment, the bit lines 372 and 373 may comprise vertical bit lines in a three dimensional memory array comprising comb shaped word lines. More information regarding vertical bit line three dimensional memory arrays may be found in U.S. Provisional Application 61/526,764, "Optimized Architecture for Three Dimensional Non-Volatile Storage Device with Vertical Bit Lines" and U.S. patent application Ser. No. 13/323,573, "Three Dimensional Non-Volatile Storage with Multi Block Row Selection."

Figure 4A:
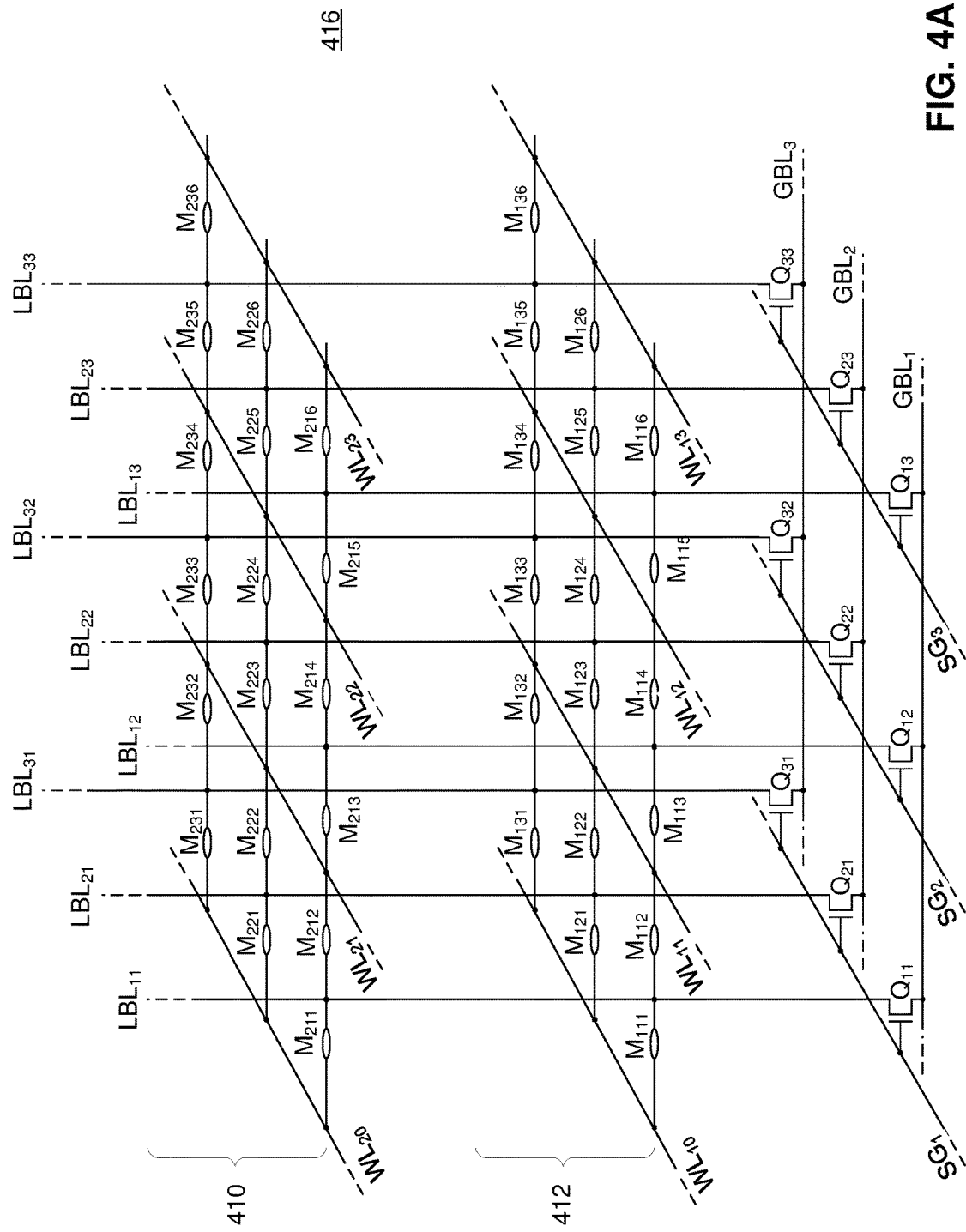
FIG. 4A depicts one embodiment of a portion of a monolithic three-dimensional memory array.

FIG. 4A depicts one embodiment of a portion of a monolithic three-dimensional memory array 416 that includes a first memory level 412 positioned below a second memory level 410. Memory array 416 is one example of an implementation for memory array 301 in FIG. 1E. The local bit lines $LBL_{11}$-$LBL_{33}$ are arranged in a first direction (i.e., a vertical direction) and the word lines $WL_{10}$-$WL_{23}$ are arranged in a second direction perpendicular to the first direction. This arrangement of vertical bit lines in a monolithic three-dimensional memory array is one embodiment of a vertical bit line memory array. As depicted, disposed between the intersection of each local bit line and each word line is a particular memory cell (e.g., memory cell $M_{111}$ is disposed between local bit line $LBL_{11}$ and word line $WL_{10}$). The particular memory cell may comprise a floating gate device or a charge trap device (e.g., using a silicon nitride material). The global bit lines $GBL_1$-$GBL_3$ are arranged in a third direction that is perpendicular to both the first direction and the second direction. A set of bit line select devices (e.g., $Q_{11}$-$Q_{31}$) may be used to select a set of local bit lines (e.g., $LBL_{11}$-$LBL_{31}$). As depicted, bit line select devices $Q_{11}$-$Q_{31}$ are used to select the local bit lines $LBL_{11}$-$LBL_{31}$ and to connect the local bit lines $LBL_{11}$-$LBL_{31}$ to the global bit lines $GBL_1$-$GBL_3$ using row select line $SG_1$. Similarly, bit line select devices $Q_{12}$-$Q_{32}$ are used to selectively connect the local bit lines $LBL_{12}$-$LBL_{32}$ to the global bit lines $GBL_1$-$GBL_3$ using row select line $SG_2$ and bit line select devices $Q_{13}$-$Q_{33}$ are used to selectively connect the local bit lines $LBL_{13}$-$LBL_{33}$ to the global bit lines $GBL_1$-$GBL_3$ using row select line $SG_3$.

Referring to FIG. 4A, as only a single bit line select device is used per local bit line, only the voltage of a particular global bit line may be applied to a corresponding local bit line. Therefore, when a first set of local bit lines (e.g., $LBL_{11}$-$LBL_{31}$) is biased to the global bit lines $GBL_1$-$GBL_3$, the other local bit lines (e.g., $LBL_{12}$-$LBL_{32}$ and $LBL_{13}$-$LBL_{33}$) must either also be driven to the same global bit lines $GBL_1$-$GBL_3$ or be floated. In one embodiment, during a memory operation, all local bit lines within the memory array are first biased to an unselected bit line voltage by connecting each of the global bit lines to one or more local bit lines. After the local bit lines are biased to the unselected bit line voltage, then only a first set of local bit lines $LBL_{11}$-$LBL_{31}$ are biased to one or more selected bit line voltages via the global bit lines $GBL_1$-$GBL_3$, while the other local bit lines (e.g., $LBL_{12}$-$LBL_{32}$ and $LBL_{13}$-$LBL_{33}$) are floated. The one or more selected bit line voltages may correspond with, for example, one or more read voltages during a read operation or one or more programming voltages during a programming operation.

In one embodiment, a vertical bit line memory array, such as memory array 416, includes a greater number of memory cells along the word lines as compared with the number of memory cells along the vertical bit lines (e.g., the number of memory cells along a word line may be more than 10 times the number of memory cells along a bit line). In one example, the number of memory cells along each bit line may be 16 or 32, while the number of memory cells along each word line may be 2048 or more than 4096.

Figure 4B:
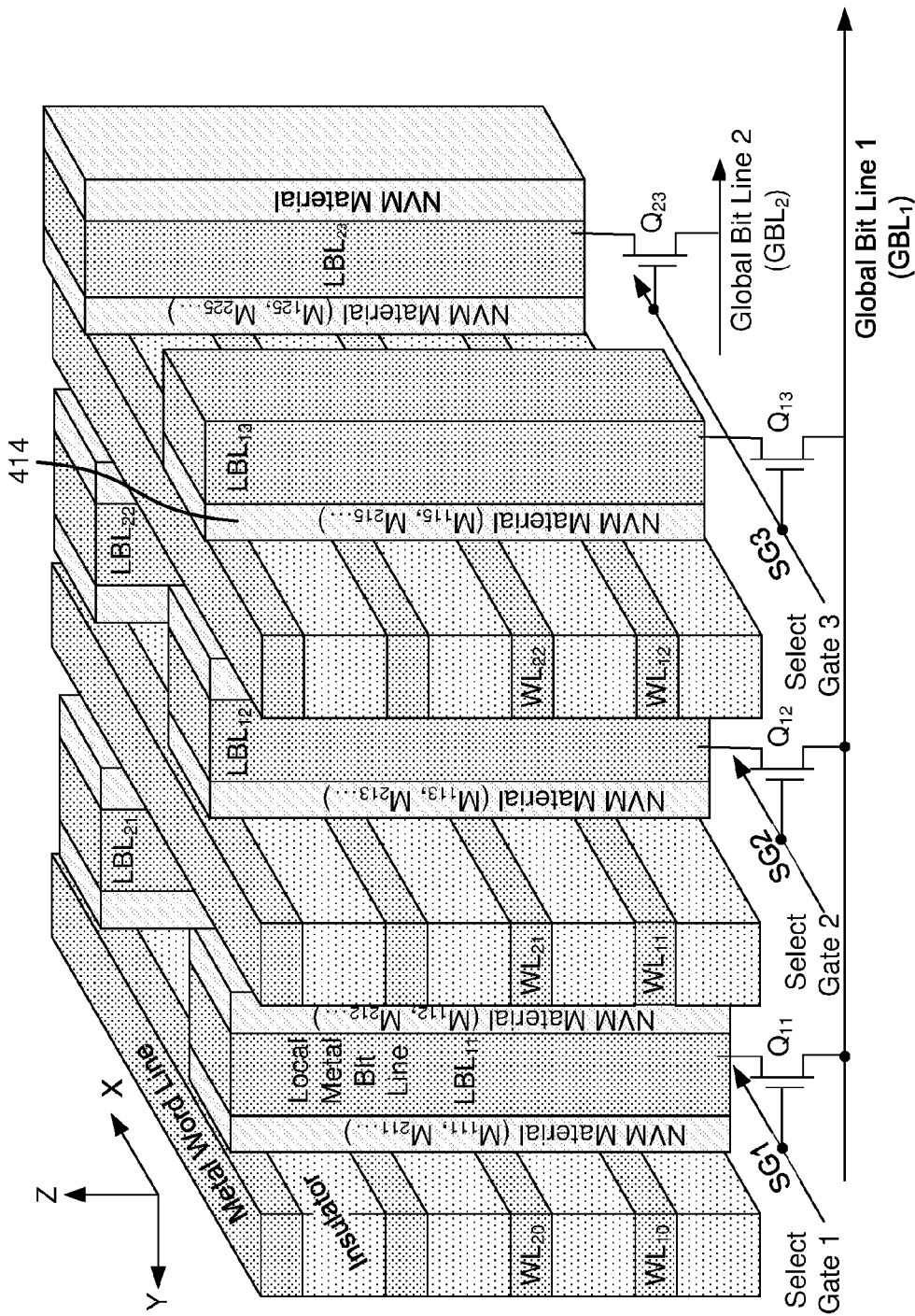
FIG. 4B depicts one embodiment of a portion of a monolithic three-dimensional memory array that includes vertical strips of a non-volatile memory material.

FIG. 4B depicts one embodiment of a portion of a monolithic three-dimensional memory array that includes vertical strips of a non-volatile memory material. The physical structure depicted in FIG. 4B may comprise one implementation for a portion of the monolithic three-dimensional memory array depicted in FIG. 4A. The vertical strips of non-volatile memory material may be formed in a direction that is perpendicular to a substrate (e.g., in the Z direction). A vertical strip of the non-volatile memory material 414 may include, for example, a vertical oxide layer, a vertical metal oxide layer (e.g., nickel oxide or hafnium oxide), a vertical layer of phase change material, or a vertical charge trapping layer (e.g., a layer of silicon nitride). The vertical strip of material may comprise a single continuous layer of material that may be used by a plurality of memory cells or devices. In one example, portions of the vertical strip of the non-volatile memory material 414 may comprise a part of a first memory cell associated with the cross section between $WL_{12}$ and $LBL_{13}$ and a part of a second memory cell associated with the cross section between $WL_{22}$ and $LBL_{13}$. In some cases, a vertical bit line, such as $LBL_{13}$, may comprise a vertical structure (e.g., a rectangular prism, a cylinder, or a pillar) and the non-volatile material may completely or partially surround the vertical structure (e.g., a conformal layer of phase change material surrounding the sides of the vertical structure). As depicted, each of the vertical bit lines may be connected to one of a set of global bit lines via a select transistor. The select transistor may comprise a MOS device (e.g., an NMOS device) or a vertical TFT.

More information regarding the structure and operation of vertical bit line memory arrays may be found in U.S. Provisional Application 61/423,007, entitled "Non-Volatile Memory Having 3D Array of Read/Write Elements With Vertical Bit Lines and Laterally Aligned Active Elements and Methods Thereof" and U.S. patent application Ser. No. 13/323,703, entitled "Three Dimensional Non-Volatile Storage with Three Device Driver for Row Select."

Figure 5A:
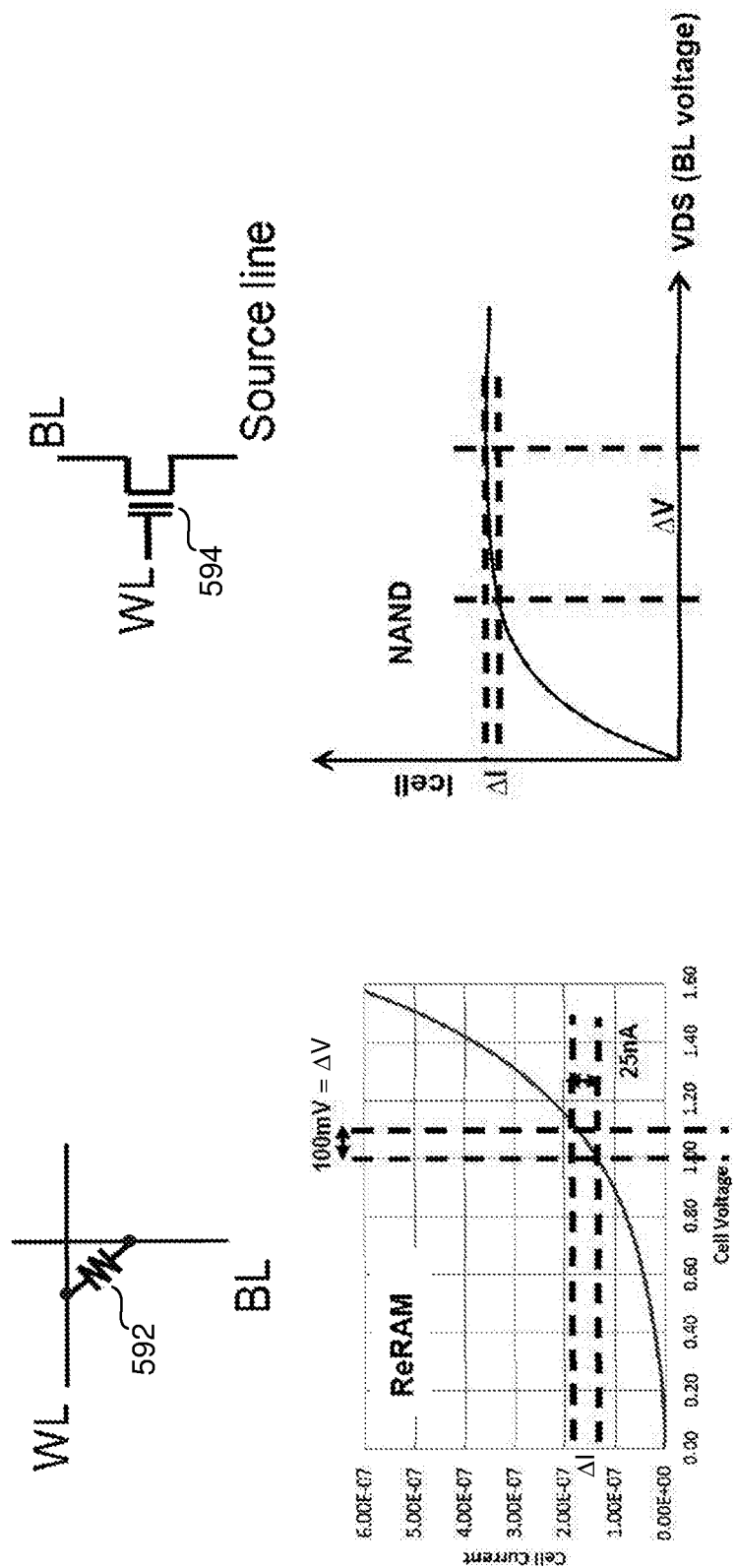
FIG. 5A depicts one embodiment of the IV characteristics of a Re RAM memory cell and a floating gate transistor.

FIG. 5A depicts one embodiment of the IV characteristics of a ReRAM memory cell 592 and a floating gate transistor 594. As depicted, a small increase in the voltage applied across the ReRAM memory cell 592 (e.g., due to an increase of 100 mV on the bit line) corresponds with an exponential increase in the current through the memory cell (e.g., an increase of 25 nA). Thus, the non-linear IV characteristics of the ReRAM memory cell may lead to a large variation in memory cell current given a small change in an applied bit line voltage. This is in contrast to the less sensitive change in memory cell current for a floating gate transistor, such as floating gate transistor 594, given a change in the bit line voltage.

Figure 5C:
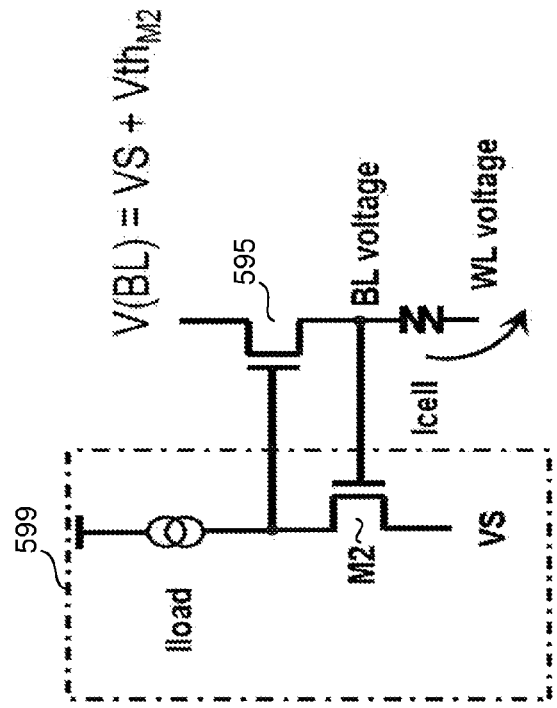
FIG. 5C depicts another embodiment of a bit line precharge circuit including a first transistor in a source follower configuration and an amplifier including a second transistor providing closed-loop feedback for regulating a bit line voltage.
Figure 5B:
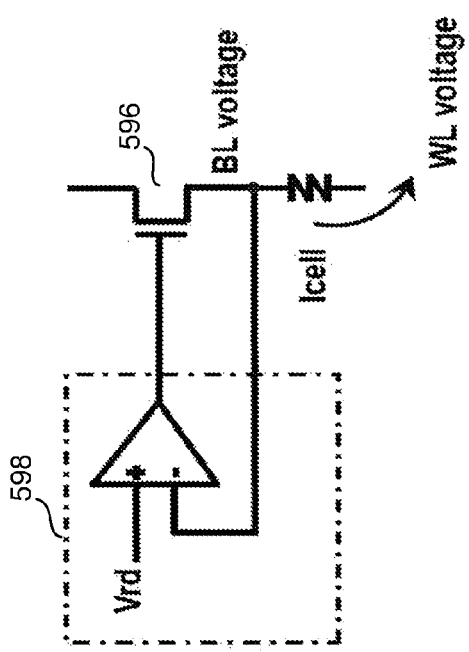
FIG. 5B depicts one embodiment of a bit line precharge circuit including a first transistor in a source follower configuration and an amplifier providing closed-loop feedback for regulating a bit line voltage.

FIG. 5B depicts one embodiment of a bit line precharge circuit including a first transistor 596 in a source follower configuration and an amplifier 598 providing closed-loop feedback for regulating a bit line voltage. As depicted, the amplifier 598 in conjunction with the first transistor 596 may regulate the bit line voltage to a read voltage (Vrd).

FIG. 5C depicts another embodiment of a bit line precharge circuit including a first transistor 595 in a source follower configuration and an amplifier 599 including a second transistor M2 providing closed-loop feedback for regulating a bit line voltage. As depicted, the second transistor M2 in conjunction with the first transistor 595, may regulate the bit line voltage to a read voltage equivalent to (or substantially close to) a source voltage (VS) plus the gate to source voltage of the second transistor M2 (which, depending on device sizing, may be roughly the threshold voltage for the second transistor M2 or $Vth_{M2}$). In one example, if the bit line voltage is higher than the read voltage, then the current through the second transistor M2 will increase, thereby reducing the voltage applied to the gate of the first transistor 595, thereby decreasing the current through the first transistor 595, thereby reducing the bit line voltage. If the bit line voltage is lower than the read voltage, then the current through the second transistor M2 will decrease, thereby increasing the voltage applied to the gate of the first transistor 595, thereby increasing the current through the first transistor 595, thereby increasing the bit line voltage. Thus, the local feedback dynamically controls the gate voltage applied to the first transistor 595 such that the source node of the first transistor 595 is regulated to the read voltage.

Figure 5D:
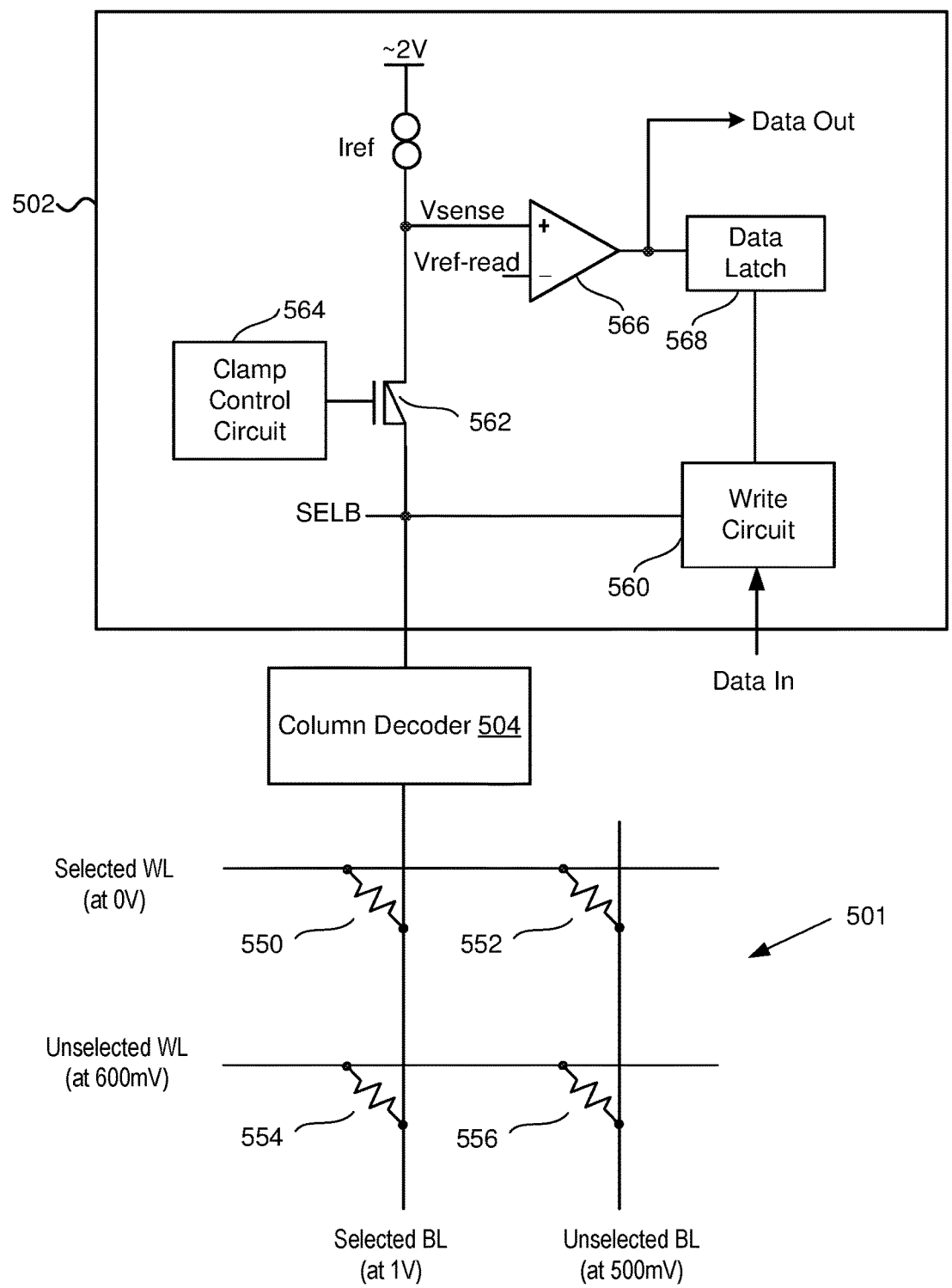
FIG. 5D depicts one embodiment of a read/write circuit along with a portion of a memory array.

FIG. 5D depicts one embodiment of a read/write circuit 502 along with a portion of a memory array 501. Read/write circuit 502 is one example of an implementation of read/write circuit 306 in FIG. 1D. The portion of a memory array 501 includes two of the many bit lines (one selected bit line labeled "Selected BL" and one unselected bit line labeled "Unselected BL") and two of the many word lines (one selected word line labeled "Selected WL" and one unselected word line labeled "Unselected WL"). The portion of a memory array also includes a selected memory cell 550 and unselected memory cells 552-556. In one embodiment, the portion of a memory array 501 may comprise a memory array with bit lines arranged in a direction horizontal to the substrate, such as memory array 201 in FIG. 3A. In another embodiment, the portion of a memory array 501 may comprise a memory array with bit lines arranged in a vertical direction that is perpendicular to the substrate, such as memory array 416 in FIG. 4A.

As depicted, during a memory array operation (e.g., a read operation), the selected bit line may be biased to 1V, the unselected word line may be biased to 0.6V, the selected word line may be biased to 0V, and the unselected bit line may be biased to 0.5V. In some embodiments, during a second memory array operation, the selected bit line may be biased to a selected bit line voltage (e.g., 2.0V), the unselected word line may be biased to an unselected word line voltage (e.g., 1.0V), the selected word line may be biased to a selected word line voltage (e.g., 0V), and the unselected bit line may be biased to an unselected bit line voltage (e.g., 1V). In this case, the unselected memory cells sharing the selected word line will be biased to the voltage difference between the selected word line voltage and the unselected bit line voltage. In other embodiments, the memory array biasing scheme depicted in FIG. 5A may be reversed such that the selected bit line is biased to 0V, the unselected word line is biased to 0.4V, the selected word line is biased to 1V, and the unselected bit line is biased to 0.5V.

As depicted, the SELB node of read/write circuit 502 may be electrically coupled to the selected bit line via column decoder 504. In one embodiment, column decoder 504 may correspond with column decoder 302 depicted in FIG. 1E. Transistor 562 couples (or electrically connects) node SELB to the Vsense node. The transistor 562 may comprise a low VT nMOS device. Clamp control circuit 564 controls the gate of transistor 562. The Vsense node is connected to reference current Iref and one input of sense amplifier 566. The other input of sense amplifier 566 receives Vref-read, which is the voltage level used for comparing the Vsense node voltage in read mode. The output of sense amplifier 566 is connected to the data out terminal and to data latch 568. Write circuit 560 is connected to node SELB, the Data In terminal, and data latch 568.

In one embodiment, during a read operation, read/write circuit 502 biases the selected bit line to the selected bit line voltage in read mode. Prior to sensing data, read/write circuit 502 will precharge the Vsense node to 2V (or some other voltage greater than the selected bit line voltage). When sensing data, read/write circuit 502 attempts to regulate the SELB node to the selected bit line voltage (e.g., 1V) via clamp control circuit 564 and transistor 562 in a source-follower configuration. If the current through the selected memory cell 550 is greater than the read current limit, Iref, then, over time, the Vsense node will fall below Vref-read (e.g., set to 1.5V) and the sense amplifier 566 will read out a data "0." In some cases, the Vsense node may be precharged to 2V (or another voltage greater than the bit line voltage applied to a selected bit line) during a precharge phase of a sensing operation and then during a sensing phase of the sensing operation, the read current limit or reference current, Iref, may be set to zero such that the only current path from the Vsense node is through the transistor 562. Outputting a data "0" represents that the selected memory cell 550 is in a low resistance state (e.g., a SET state). If the current through the selected memory cell 550 is less than Iref, then the Vsense node will stay above Vref-read and the sense amplifier 566 will read out a data "1." Outputting a data "1" represents that the selected memory cell 550 is in a high resistance state (e.g., a RESET state). Data latch 568 may latch the output of sense amplifier 566 after a time period of sensing the current through the selected memory cell (e.g., after 400 ns).

In one embodiment, during a write operation, if the Data In terminal requests a data "0" to be written to a selected memory cell, then read/write circuit 502 may bias SELB to the selected bit line voltage for programming a data "0" in write mode (e.g., 1.2V for a SET operation) via write circuit 560. The duration of programming the memory cell may be a fixed time period (e.g., using a fixed-width programming pulse) or variable (e.g., using a write circuit 560 that senses whether a memory cell has been programmed while programming). More information regarding write circuits that can sense while programming data can be found in U.S. Pat. No. 6,574,145, "Memory Device and Method for Sensing While Programming a Non-Volatile Memory Cell." If the Data In terminal requests a data "1" to be written, then read/write circuit 502 may bias SELB to the selected bit line voltage for programming a data "1" in write mode (e.g., 0V or −1.2V for a RESET operation) via write circuit 560. In some cases, if a selected memory cell is to maintain its current state, then the write circuit 560 may bias SELB to a program inhibit voltage during write mode. The program inhibit voltage may be the same as or close to the unselected bit line voltage.

Figure 5E:
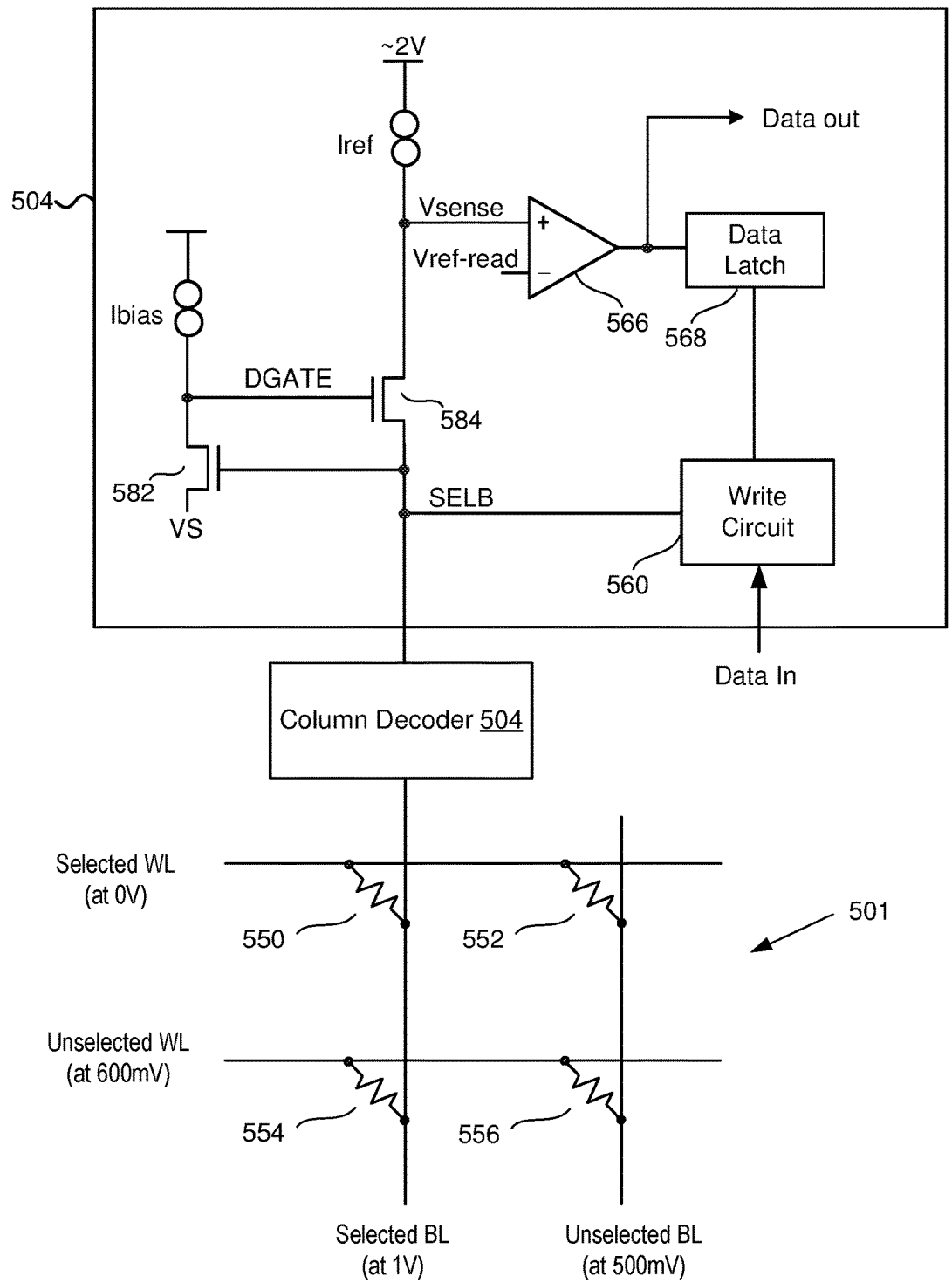
FIG. 5E depicts one embodiment of a read/write circuit including a bit line precharge circuit.

FIG. 5E depicts one embodiment of a read/write circuit 504 including a bit line precharge circuit. Read/write circuit 504 is one example of an implementation of read/write circuit 306 in FIG. 1D. The bit line precharge circuit includes a first transistor 584 and a second transistor 582. The source node of the first transistor 584 (labeled the SELB node) connects to column decoder 504 and connects to the gate of second transistor 582. The source node of second transistor 582 is connected to a source voltage (VS). The drain node of the second transistor 582 (labeled the DGATE node) connects to the gate of the first transistor 584 and connects to a bias current (Ibias). The drain node of the first transistor 584 (labeled the Vsense node) connects to a reference current and one input of comparator 566. In some cases, the reference current may only be enabled during a sensing phase for sensing a current through a memory cell, while during a precharge phase for charging the selected bit line, the reference current may be disabled or bypassed by a pull-up path (e.g., via a PMOS device) to the power supply. In other cases, the reference current may provide a first reference current during the precharge phase (e.g., 1 mA) and a second reference current different from the first reference current during the sensing phase (e.g., 50 nA). The first reference current may be greater than the second reference current. In other cases, the reference current may be set to a first reference current during the precharge phase and then disabled during the sensing phase.

In some embodiments, prior to sensing the current through a selected memory cell, the read/write circuit 504 may precharge a selected bit line connected to the selected memory cell to a read voltage (e.g., 1.0V) using the bit line precharge circuit. The selected bit line may be precharged to a bit line voltage based on the source voltage applied to the source node of the second transistor 582. While precharging the selected bit line, the reference current may be set to a high current value in order to precharge the selected bit line quickly. Once the selected bit line has been precharged, the selected memory cell may be sensed (e.g., by allowing an integration capacitor connected to the Vsense node to discharge based on the current through the selected memory cell). After sensing the selected memory cell over a sensing time period, the resulting voltage of the Vsense node may be compared with a read mode reference voltage (Vref-read) to determine a state of the selected memory cell.

Figure 5F:
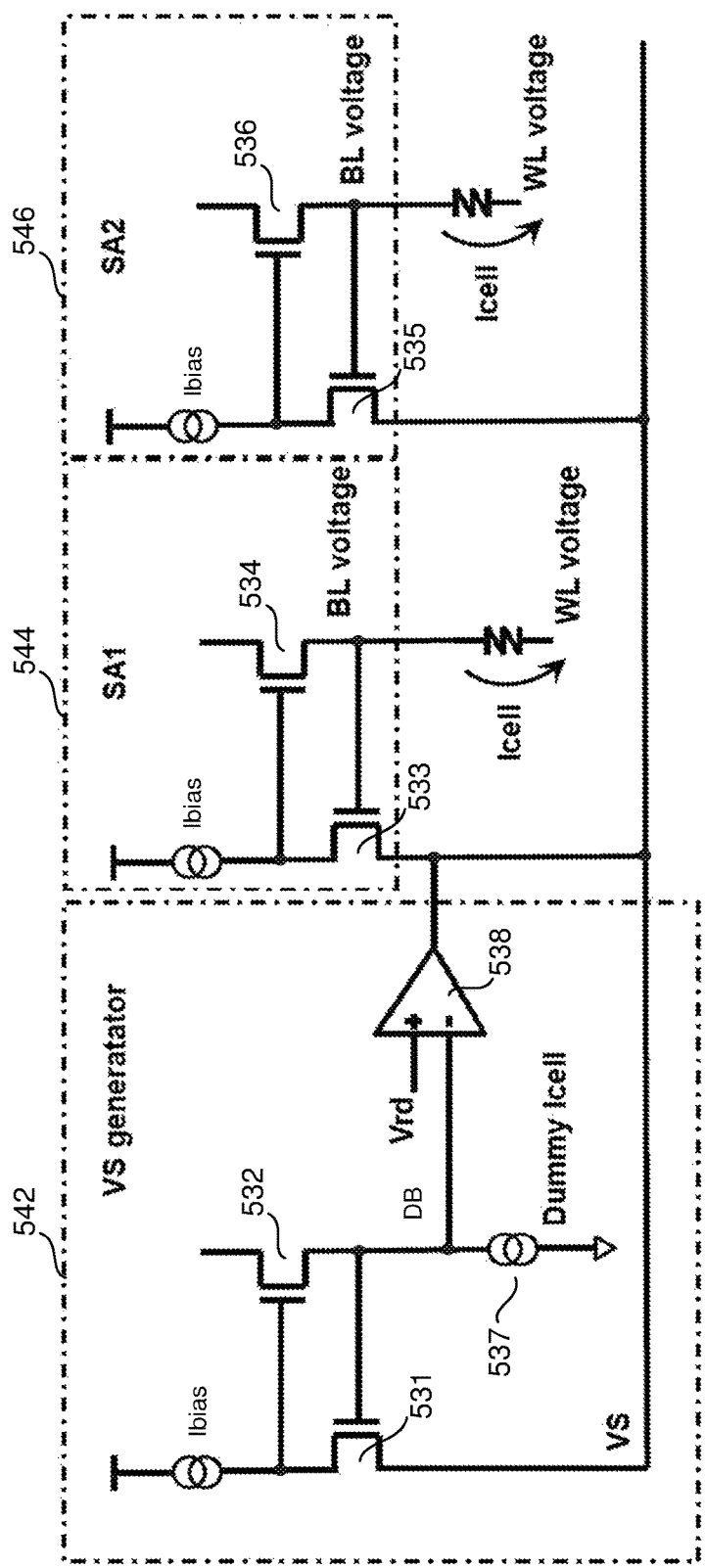
FIG. 5F depicts one embodiment of a source voltage generator for generating a source voltage that is used by one or more bit line precharge circuits for precharging one or more bit lines to a read voltage.

FIG. 5F depicts one embodiment of a source voltage generator 542 for generating a source voltage that is used by one or more bit line precharge circuits for precharging one or more bit lines to a read voltage. As depicted, the source voltage generator 542 includes transistors 531-532 and a differential amplifier 538. The transistors 531-532 replicate a bit line precharge circuit with transistor 532 arranged in a source-follower configuration driving a dummy bit line node (DB) and transistor 531 controlling the gate of the transistor 532. The inputs to the differential amplifier 538 are a read voltage (Vrd) and the dummy bit line node. The output of the differential amplifier 538 is the source voltage (VS) which is connected to the source node of transistor 531. The closed-loop feedback within the source voltage generator 542 regulates the dummy bit line node to the read voltage given a dummy memory cell current (Dummy (cell)) drawn from the dummy bit line node. The dummy memory cell current may be generated using one or more dummy memory cells. In one embodiment, the one or more dummy memory cells may part of a memory array in which selected memory cells within the memory array are selected for sensing. In another embodiment, the one or more dummy memory cells may correspond with a selected word line associated with memory cells that have been selected for sensing (e.g., the selected word line may connect to both the memory cells that have been selected for sensing and the one or more dummy memory cells). In some cases, rather than using dummy memory cells, a dummy memory cell current may be derived from a bandgap-based current reference or a temperature insensitive current reference.

As depicted in FIG. 5F, a first sense amplifier 544 is electrically coupled to a first selected bit line and a second sense amplifier 546 is electrically coupled to a second selected bit line. The first sense amplifier 544 includes a first bit line precharge circuit including transistor 534 arranged in a source-follower configuration driving the first selected bit line and transistor 533 controlling the gate of the transistor 534. The second sense amplifier 546 includes a second bit line precharge circuit including transistor 536 arranged in a source-follower configuration driving the second selected bit line and transistor 535 controlling the gate of the transistor 536. The source voltage generated by the source voltage generator 542 connects to the first bit line precharge circuit at the source node of transistor 533 and connects to the second bit line precharge circuit at the source node of transistor 535.

In some cases, the source voltage generator 542 may generate a source voltage that compensates for temperature variations and/or process variations. In one example, the source voltage generator 542 may generate a source voltage such that the one or more bit line precharge circuits precharge one or more bit lines to a read voltage that is constant or substantially insensitive to temperature variations (e.g., the read voltage may be held nearly constant within a temperature range from −25 degrees Celsius to 105 degrees Celsius) and process variations (e.g., shifts in transistor threshold voltages ranging from a fast process corner to a slow process corner). Thus, the source voltage generator 542 may provide the one or more bit line precharge circuits with a source voltage that varies over temperature and process variations such that the read voltage applied to the one or more bit lines does not vary substantially with temperature or process variations.

Figure 6A:
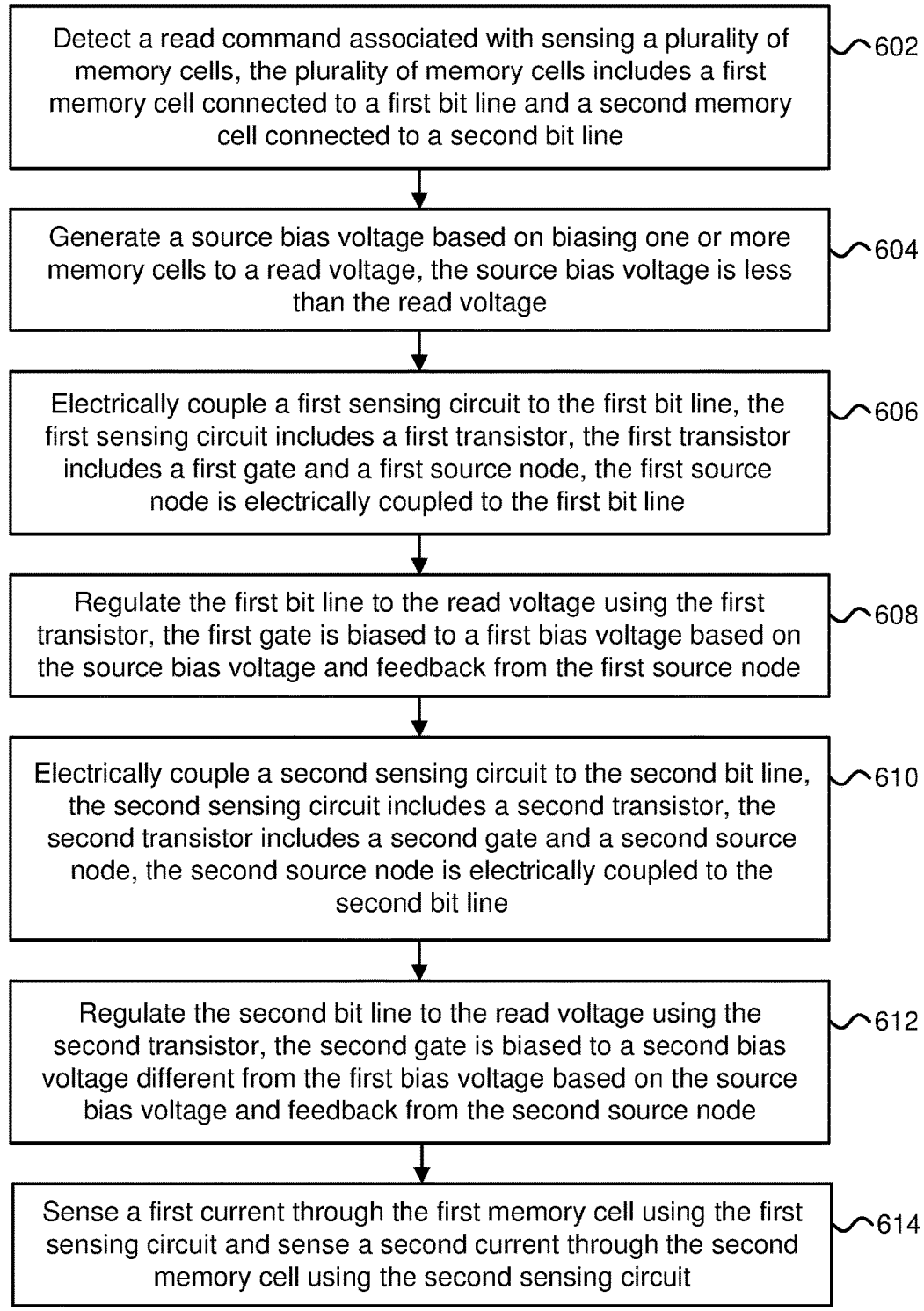
FIG. 6A is a flowchart describing one embodiment of a process for sensing memory cells.

FIG. 6A is a flowchart describing one embodiment of a process for sensing memory cells. In one embodiment, the process of FIG. 6A may be performed by a memory system, such as memory system 101 in FIG. 1A.

In step 602, a read command associated with sensing a plurality of memory cells is detected. The plurality of memory cells may include a first memory cell connected to a first bit line and a second memory cell connected to a second bit line. The read command may be acquired from a host, such as host 106 in FIG. 1A. The plurality of memory cells may comprise ReRAM memory cells. In step 604, a source bias voltage is generated. The source bias voltage may be generated based on biasing one or more memory cells to a read voltage. The source bias voltage may be less than the read voltage. In one example, the source bias voltage may be generated using a source voltage generator, such as source voltage generator 542 in FIG. 5F. In some cases, the read voltage may be more than a transistor threshold voltage greater than the source bias voltage.

In step 606, a first sensing circuit is electrically coupled to the first bit line. The first sensing circuit may be electrically coupled to the first bit line via a column decoder, such as column decoder 504 in FIG. 5E. The first sensing circuit may include a first transistor. The first transistor may include a first gate and a first source node. The first source node may be electrically coupled to the first bit line (e.g., via a column decoder). In step 608, the first bit line is regulated to the read voltage using the first transistor. The first gate may be biased to a first bias voltage based on the source bias voltage and feedback from the first source node. In one example, the first source node may drive a gate of a common source amplifier, the source bias voltage may connect to the source of the common source amplifier, and the drain of the common source amplifier may connect to the first gate.

In step 610, a second sensing circuit is electrically coupled to the second bit line. The second sensing circuit may include a second transistor. The second transistor may include a second gate and a second source node. The second source node may be electrically coupled to the second bit line (e.g., via a column decoder). In step 612, the second bit line is regulated to the read voltage using the second transistor. The second gate may be biased to a second bias voltage different from the first bias voltage based on the source bias voltage and feedback from the second source node. In one example, the second source node may drive a gate of a second common source amplifier, the source bias voltage may connect to the source of the second common source amplifier, and the drain of the second common source amplifier may connect to the second gate. In one embodiment, the second memory cell may comprise an OFF memory cell or a weakly conducting memory cell and the first memory cell may comprise an ON memory cell or a strongly conducting memory cell. In step 614, a first current through the first memory cell is sensed using the first sensing circuit and a second current through the second memory cell is sensed using the second sensing circuit. The first current may be greater than the second current.

Figure 6B:
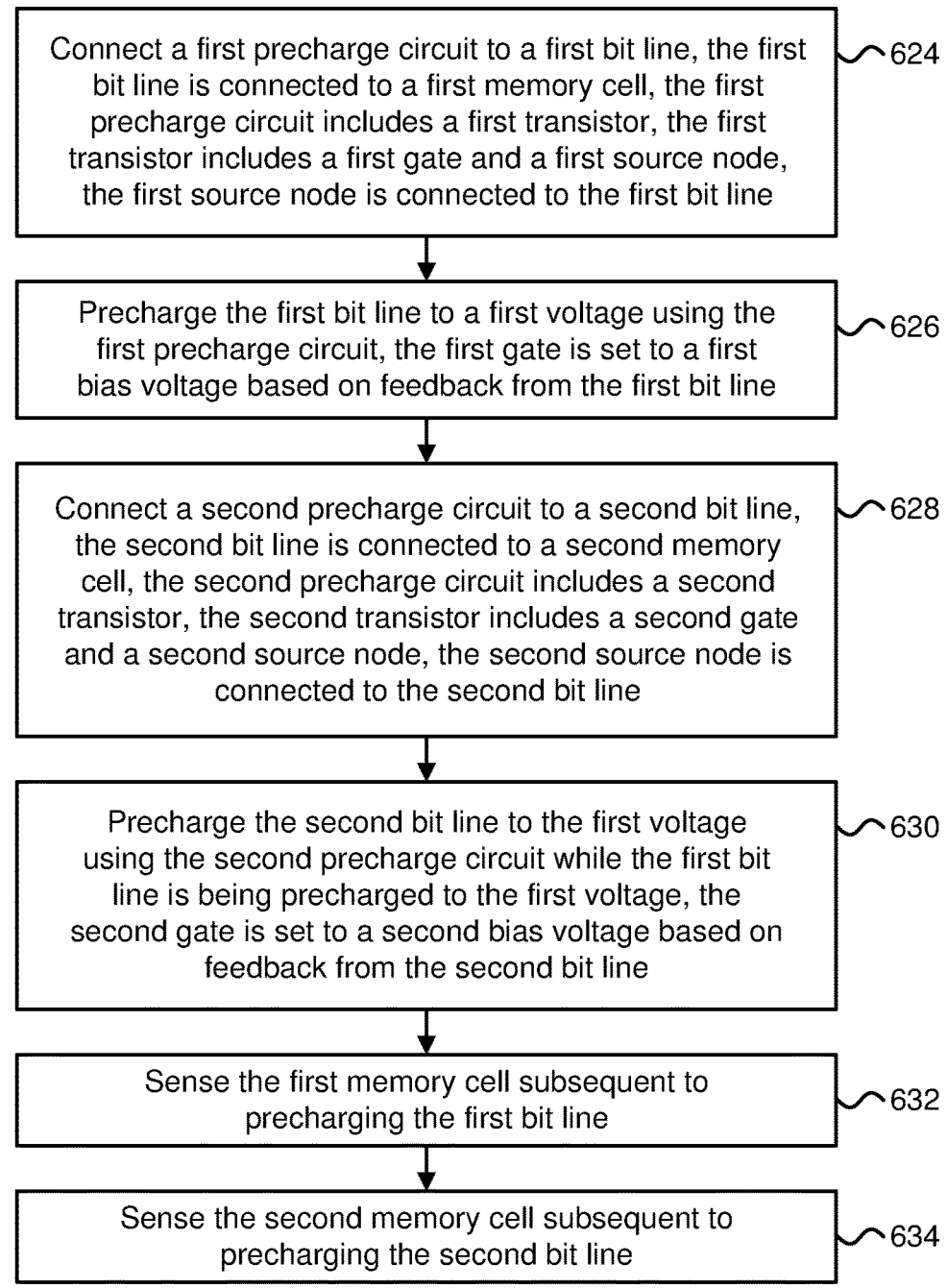
FIG. 6B is a flowchart describing one embodiment of a process for precharging bit lines during a memory operation.

FIG. 6B is a flowchart describing one embodiment of a process for precharging bit lines during a memory operation. In one embodiment, the process of FIG. 6B may be performed by a memory system, such as memory system 101 in FIG. 1A.

In step 624, a first precharge circuit is connected to a first bit line. The first precharge circuit may be connected to the first bit line via a bit line decoder. The first bit line may be connected to a first memory cell. The first precharge circuit may include a first transistor. The first transistor may include a first gate and a first source node. The first source node may be connected to the first bit line (e.g., via a bit line decoder). The first memory cell may comprise a ReRAM memory cell. In step 626, the first bit line may be precharged to a first voltage using the first precharge circuit. The first voltage may comprise a read voltage. The first gate may be set to a first bias voltage based on feedback from the first bit line. In one example, the first gate may be set using a common source amplifier whose gate is connected to the first bit line.

In step 628, a second precharge circuit is connected to a second bit line. The second bit line may be connected to a second memory cell. The second precharge circuit may include a second transistor. The second transistor may include a second gate and a second source node. The second source node may be connected to the second bit line. In step 630, the second bit line is precharged to the first voltage using the second precharge circuit while the first bit line is being precharged to the first voltage. The second gate may be set to a second bias voltage based on feedback from the second bit line. In one example, the second gate may be set using a common source amplifier whose gate is connected to the second bit line. The first bias voltage may be different than the second bias voltage. In one embodiment, the first bias voltage may be greater than the second bias voltage if the first memory cell comprises a strongly conducting memory cell and the second memory cell comprises a weakly conducting memory cell.

In step 632, the first memory cell is sensed subsequent to precharging the first bit line. In step 634, the second memory cell is sensed subsequent to precharging the second bit line.

Figure 6C:
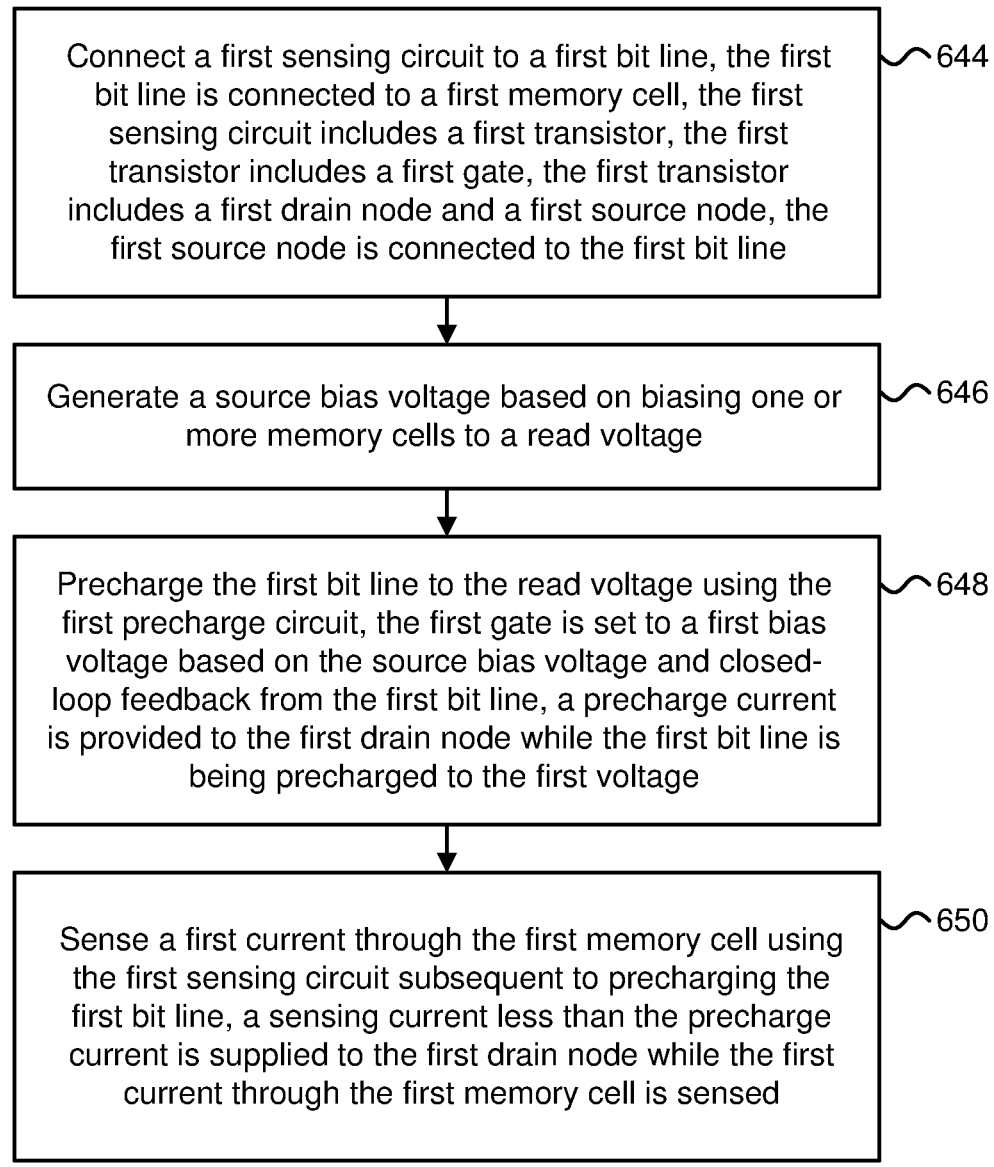
FIG. 6C is a flowchart describing an alternative embodiment of a process for sensing memory cells during a memory operation.

FIG. 6C is a flowchart describing an alternative embodiment of a process for sensing memory cells during a memory operation. In one embodiment, the process of FIG. 6C may be performed by a memory system, such as memory system 101 in FIG. 1A.

In step 644, a first sensing circuit is connected to a first bit line. The first bit line may be connected to a first memory cell. The first sensing circuit may include a first transistor that includes a first gate. The first transistor may include a first drain node and a first source node. The first source node may be connected to the first bit line (e.g., via a bit line decoder). In step 646, a source bias voltage is generated. In one example, the source bias voltage may be generated by biasing one or more memory cells to a read voltage. In another example, the source bias voltage may be generated using a temperature dependent reference. The source bias voltage may vary based on temperature. For example, the source bias voltage may be complementary to absolute temperature or be reduced as temperature increases. The one or more memory cells may comprise one or more dummy memory cells (i.e., memory cells that are not used for storing user data). In step 648, the first bit line is precharged to the read voltage using the first precharge circuit. The first gate may be set to a first bias voltage based on the source bias voltage and closed-loop feedback from the first bit line. A precharge current may be provided to the first drain node while the first bit line is being precharge the first voltage. The precharge current may limit the rate at which the first bit line is precharged to the read voltage.

In step 650, a first current to the first memory cell is sensed using the first sensing circuit subsequent to precharging the first bit line. A sensing current less than the precharge current may be supplied to the first drain node while the first current through the first memory cell is sensed.

One embodiment of the disclosed technology includes connecting a first sense amplifier to a first bit line. The first bit line is connected to a first memory cell. The first sense amplifier includes a first precharge circuit. The first precharge circuit includes a first transistor. The first transistor includes a first gate and a first source node. The first source node is connected to the first bit line. The method further comprises precharging the first bit line to a first voltage using the first precharge circuit. The precharging the first bit line includes setting the first gate to a first bias voltage based on feedback from the first bit line. The method further comprises connecting a second sense amplifier to a second bit line. The second bit line is connected to a second memory cell. The second sense amplifier includes a second precharge circuit. The second precharge circuit includes a second transistor. The second transistor includes a second gate and a second source node. The second source node is connected to the second bit line. The method further comprises precharging the second bit line to the first voltage using the second precharge circuit. The precharging the second bit line includes setting the second gate to a second bias voltage based on feedback from the second bit line. The second bias voltage is different from the first bias voltage. The method further comprises sensing the first memory cell using the first sense amplifier subsequent to the precharging the first bit line and sensing the second memory cell using the second sense amplifier subsequent to the precharging the second bit line.

In some cases, the method may further comprise generating a source bias voltage. The precharging the first bit line includes setting the first gate to the first bias voltage based on feedback from the first bit line and the source bias voltage. The precharging the second bit line includes setting the second gate to the second bias voltage based on feedback from the second bit line and the source bias voltage.

One embodiment of the disclosed technology includes a plurality of memory cells and one or more managing circuits in communication with the plurality of memory cells. The plurality of memory cells includes a first memory cell and a second memory cell. The one or more managing circuits cause a first sense amplifier to be coupled to a first bit line. The first bit line is connected to the first memory cell. The first sense amplifier includes a first precharge circuit. The first precharge circuit includes a first transistor. The first transistor includes a first gate and a first source node. The first source node is connected to the first bit line. The one or more managing circuits cause the first bit line to be precharged to a read voltage using the first precharge circuit. The first precharge circuit sets the first gate to a first bias voltage based on feedback from the first bit line. The one or more managing circuits cause a second sense amplifier to be coupled to a second bit line. The second bit line is connected to the second memory cell. The second sense amplifier includes a second precharge circuit. The second precharge circuit includes a second transistor. The second transistor includes a second gate and a second source node. The second source node is connected to the second bit line. The one or more managing circuits cause the second bit line to be precharged to the read voltage using the second precharge circuit. The second precharge circuit sets the second gate to a second bias voltage based on feedback from the second bit line. The second bias voltage is different from the first bias voltage. The one or more managing circuits cause the first memory cell to be sensed using the first sense amplifier and the second memory cell to be sensed using the second sense amplifier.

One embodiment of the disclosed technology includes generating a source bias voltage, generating a read voltage, and coupling a first sensing circuit to a first bit line. The first bit line is connected to a first memory cell. The first sensing circuit includes a first transistor. The first transistor includes a first gate and a first source node. The first source node is coupled to the first bit line. The method further comprises regulating the first bit line to the read voltage using the first transistor. The first gate is set to a first bias voltage based on the source bias voltage and feedback from the first source node. The method further comprises coupling a second sensing circuit to the second bit line. The second sensing circuit includes a second transistor. The second transistor includes a second gate and a second source node. The second source node is coupled to the second bit line. The method further comprises regulating the second bit line to the read voltage using the second transistor. The second gate is set to a second bias voltage different from the first bias voltage based on the source bias voltage and feedback from the second source node. The method further comprises sensing a first current through the first memory cell using the first sensing circuit subsequent to the regulating the first bit line and sensing a second current through the second memory cell using the second sensing circuit subsequent to the regulating the second bit line.

For purposes of this document, each process associated with the disclosed technology may be performed continuously and by one or more computing devices. Each step in a process may be performed by the same or different computing devices as those used in other steps, and each step need not necessarily be performed by a single computing device.

For purposes of this document, reference in the specification to "an embodiment," "one embodiment," "some embodiments," or "another embodiment" may be used to described different embodiments and do not necessarily refer to the same embodiment.

For purposes of this document, a connection can be a direct connection or an indirect connection (e.g., via another part).

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus, comprising:
   a first bit line biasing circuit including a first transistor, a source of the first transistor connected to a first bit line, the first bit line connected to a first memory cell, the first bit line biasing circuit configured to set a gate of the first transistor to a first voltage such that the first bit line is biased towards a particular voltage during a first time period;
   a third transistor, a gate of the third transistor connected to the source of the first transistor, a drain of the third transistor connected to the gate of the first transistor;
   a second bit line biasing circuit including a second transistor, a source of the second transistor connected to a second bit line, the second bit line connected to a second memory cell, the second memory cell and the first memory cell are connected to a word line, the second bit line biasing circuit configured to set a gate of the second transistor to a second voltage different from the first voltage such that the second bit line is biased towards the particular voltage during the first time period; and
   a fourth transistor, a gate of the fourth transistor connected to the source of the second transistor, a drain of the fourth transistor connected to the gate of the second transistor.

2. The apparatus of claim 1, wherein:
   the first bit line is biased at the particular voltage during the first time period; and
   the second bit line is biased at the particular voltage during the first time period.

3. The apparatus of claim 1, wherein:
   the particular voltage comprises a read voltage during the first time period; and
   the first voltage is greater than the second voltage during the first time period.

4. The apparatus of claim 1, wherein:
   the first bit line biasing circuit configured to determine the first voltage based on feedback from the first bit line; and
   the second bit line biasing circuit configured to determine the second voltage based on feedback from the second bit line.

5. The apparatus of claim 1, further comprising:
   a word line driver configured to set the word line to ground during the first time period.

6. The apparatus of claim 1, wherein:
   the first transistor comprises a first NMOS transistor; and
   the second transistor comprises a second NMOS transistor.

7. The apparatus of claim 1, wherein:
   the first memory cell and the second memory cell are part of a cross-point memory array.

8. The apparatus of claim 1, wherein:
   the first memory cell comprises a two-terminal memory cell.

9. The apparatus of claim 1, wherein:
   the first memory cell comprises a resistance-switching material.

10. The apparatus of claim 9, wherein:
    the resistance-switching material comprises a metal oxide.

11. A system, comprising:
    means for electrically connecting a source of a first transistor to a first bit line, the first bit line connected to a first memory cell;
    means for electrically connecting a source of a second transistor to a second bit line, the second bit line connected to a second memory cell, the second memory cell and the first memory cell are connected to a word line;

means for setting the gate of the first transistor to a first voltage such that the first bit line is biased at a particular voltage during a first time period;

means for setting the gate of the second transistor to a second voltage different from the first voltage such that the second bit line is biased at the particular voltage during the first time period;

means for sensing a first current through the first memory cell during the first time period while the gate of the first transistor is set to the first voltage; and means for sensing a second current through the second memory cell during the first time period while the gate of the second transistor is set to the second voltage.

12. The system of claim 11, wherein:

the first memory cell and the second memory cell are part of a cross-point memory array.

13. The system of claim 11, wherein:

the first memory cell comprises a two-terminal memory cell.

14. An apparatus, comprising:

a first biasing circuit including a first transistor, a source of the first transistor connected to a first bit line, the first bit line connected to a first memory cell, the first biasing circuit configured to bias a gate of the first transistor to a first voltage such that the first bit line is biased at a particular voltage during a first time period, the first voltage is generated based on feedback from the first bit line;

a third transistor, a gate of the third transistor connected to the source of the first transistor, a drain of the third transistor connected to the gate of the first transistor;

a second biasing circuit including a second transistor, a source of the second transistor connected to a second bit line, the second bit line connected to a second memory cell, the second memory cell and the first memory cell are connected to a word line, the second biasing circuit configured to bias a gate of the second transistor to a second voltage different from the first voltage such that the second bit line is biased at the particular voltage during the first time period, the second voltage is generated based on feedback from the second bit line; and a fourth transistor, a gate of the fourth transistor connected to the source of the second transistor, a drain of the fourth transistor connected to the gate of the second transistor.

15. The apparatus of claim 14, wherein:

the particular voltage comprises a read voltage during the first time period; and the first voltage is greater than the second voltage during the first time period.

16. The apparatus of claim 14, wherein:

the first memory cell and the second memory cell are part of a cross-point memory array.

17. The apparatus of claim 14, wherein:

the first memory cell comprises a two-terminal memory cell.

* * * * *